US009877107B2

(12) United States Patent
Painter et al.

(10) Patent No.: US 9,877,107 B2
(45) Date of Patent: Jan. 23, 2018

(54) PROCESSING AUDIO SIGNALS

(71) Applicant: Marvell World Trade Ltd., St. Michael (BB)

(72) Inventors: Christopher Painter, Santa Clara, CA (US); Erfan Soltanmohammadi, Campbell, CA (US); Kapil Jain, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/278,004

(22) Filed: Sep. 27, 2016

(65) Prior Publication Data

US 2017/0111737 A1 Apr. 20, 2017

Related U.S. Application Data

(60) Provisional application No. 62/243,930, filed on Oct. 20, 2015, provisional application No. 62/365,611, filed on Jul. 22, 2016.

(51) Int. Cl.
*H03G 5/00* (2006.01)
*H04R 3/04* (2006.01)
*H04R 29/00* (2006.01)

(52) U.S. Cl.
CPC ............. *H04R 3/04* (2013.01); *H04R 29/001* (2013.01); *H04R 2420/07* (2013.01); *H04R 2430/03* (2013.01)

(58) Field of Classification Search
CPC .... H04R 3/04; H04R 29/001; H04R 2420/07; H04R 2430/03

(Continued)

(56) References Cited

U.S. PATENT DOCUMENTS 5,046,105 A * 9/1991 Bohn ........................ H03G 5/12 333/28 T
2005/0195995 A1 * 9/2005 Baumgarte ............ H03G 5/165 381/104

(Continued)

FOREIGN PATENT DOCUMENTS

JP 04167609 * 10/1990 ............. H03H 11/04

OTHER PUBLICATIONS

Holters, M. and Zölzer, U., "Parametric Higher-Order Shelving Filters," in Proceedings of the 14th European Signal Processing Conference (EUSIPCO 2006), EURASIP, Florence, Italy, 2006.

(Continued)

*Primary Examiner* — Quynh Nguyen

(57) ABSTRACT

An audio processing circuit comprises an analyzer circuit that includes a plurality of energy detector units, and an equalizer circuit that includes a plurality of equalization filters. The equalizer circuit is coupled with the analyzer circuit. The analyzer circuit is configured to receive an audio signal, obtain sub-bands of the audio signal using the energy detector units, measure energy of each sub-band, compare the energy of each sub-band to a threshold energy value and, based on the comparison, determine parameters for an equalization filter for processing the sub-band. The equalizer circuit is configured to receive the audio signal concurrently with reception of the audio signal by the analyzer circuit, obtain the sub-bands using the equalization filters, receive the parameters for the equalization filters from the analyzer circuit, equalize each sub-band by applying the parameters corresponding to the sub-band, and generate an output audio signal that includes the equalized sub-bands.

30 Claims, 8 Drawing Sheets

(58) Field of Classification Search
USPC .......................................................... 381/103
See application file for complete search history.

(56) References Cited

U.S. PATENT DOCUMENTS

| | | | | |
|---|---|---|---|---|
| 2007/0127746 | A1* | 6/2007 | Matsuzawa | B06B 1/0292 381/191 |
| 2010/0215193 | A1 | 8/2010 | Wihardja et al. | |
| 2010/0290654 | A1* | 11/2010 | Wiggins | H04R 25/70 381/314 |
| 2012/0300949 | A1 | 11/2012 | Rauhala et al. | |
| 2015/0222974 | A1* | 8/2015 | Johnson | H04R 1/028 381/388 |

OTHER PUBLICATIONS

Zölzer, U., editor, DAFX: Digital Audio Effects, 2 ed., John Wiley & Sons, Ltd., Chichester, UK, 2011.
European Application No. 16194562.1, Extended European Search Report dated Mar. 20, 2017, 10 pages.
Zoelzer et al., "Parametric Digital Filter Structures", Preprints of Papers Presented at 99th AES Convention, New York, Oct. 1, 1995.
Painter et al., "Active Equalization for Loudspeaker Protection", Convention Paper 9561, Presented at AES Convention 140, Paris, France, Jun. 2016.

* cited by examiner

PROCESSING AUDIO SIGNALS

CROSS REFERENCE TO RELATED APPLICATIONS

This application claims the benefit of priority under 35 U.S.C. § 119(e) of U.S. Provisional Application No. 62/243,930, filed on Oct. 20, 2015, and entitled "Loudspeaker Protection and Enhancement using Active Equalization," and of U.S. Provisional Application No. 62/365,611, filed on Jul. 22, 2016, and entitled "Active Equalization for Loudspeaker Protection," each of which is incorporated herein by reference in its entirety.

BACKGROUND

The following disclosure relates generally to devices, systems and techniques for processing audio signals.

An audio speaker, such as a loudspeaker, uses a driver to generate sound based on input audio signals. Resonances can be excited in the speaker based on the input audio signals. In some cases, the resonances can damage the speaker driver, for example, when the resonances are strongly excited.

SUMMARY

The present disclosure describes an audio processing circuit and associated systems, apparatus and techniques, which equalize an audio signal input to an audio speaker device, e.g., a loudspeaker, prior to providing the audio signal to the speaker driver, based on concurrent measurement of signal energy of the audio signal. Upon receiving an audio signal at its input, the audio processing circuit forwards the signal to two processing sections: an equalizer circuit and an analyzer circuit. The analyzer circuit includes a plurality of energy detectors that are configured to analyze the input audio signal to determine time-varying parameters, which are provided to equalization filters included in the equalizer circuit for effecting real time adjustment of the audio signal.

Analysis filters included in the energy detector circuits process the input audio signal to obtain a number of frequency sub-bands of the audio signal. In some implementations, the frequency sub-bands, which are also referred to as sub-bands, correspond to a primary resonance frequency and one or more secondary resonance frequencies of the audio speaker device.

In some implementations, each energy detector circuit processes a separate sub-band of the audio signal. An energy detector circuit measures the signal energy for the respective sub-band and compares the measured energy to a threshold energy value. In some implementations, different threshold energy values are associated with different sub-bands. Based on the comparison, the energy detector circuit determines parameters that affect a level of attenuation that is to be applied to the respective sub-band such that the corresponding signal energy is within the associated threshold energy value.

In some implementations, the equalization filters obtain the same sub-bands as obtained by the energy detector circuits, and each sub-band is associated with a distinct energy detector circuit and a distinct equalization filter. In some implementations, the number of equalization filters and the number of energy detectors correspond to the number of sub-bands of the audio signal that are processed.

An energy detector circuit associated with a certain sub-band provides, to the corresponding equalization filter associated with the same sub-band, time-varying parameters that affect the magnitude response of the equalization filter to achieve the determined level of attenuation for the sub-band. Each equalization filter in the equalizer circuit processes an associated sub-band based on the parameters received from the energy detector circuit associated with the same sub-band. For example, in some implementations, each equalization filter performs time-varying linear equalization of a sub-band based on the time-varying numerator coefficients of the transfer function of the equalization filter that are determined by the corresponding energy detector circuit. In this context, equalization refers to adjusting the signal energy level of a sub-band of the audio signal such that the energy level of the sub-band is within the threshold energy value associated with the sub-band.

In some implementations, the magnitude response of an equalization filter is matched to the magnitude response of analysis filter(s) in the energy detector circuit associated with the same sub-band of the audio signal. For example, in some implementations, the transfer function of an equalization filter has the same denominator coefficients as the analysis filter in the corresponding energy detector circuit.

In some implementations, the equalization filters are arranged in cascade in the equalizer circuit, with each equalization filter processing a separate frequency component. In some implementations, the audio processing circuit is coupled to a speaker driver (also referred to as driver) of the audio device. The overall equalized audio signal is output by the audio processing circuit to the driver. In this manner, by performing time-varying linear equalization of an audio signal prior to providing the audio signal to the driver, the audio processing circuit protects the audio device from damage under high-drive conditions.

In a general aspect, an audio processing circuit comprises an analyzer circuit that includes a plurality of energy detector units, and an equalizer circuit that includes a plurality of equalization filters. The equalizer circuit is coupled with the analyzer circuit. The analyzer circuit is configured to receive an audio signal as an input, obtain a plurality of sub-bands of the audio signal using the plurality of energy detector units, measure energy of each sub-band, compare the energy of each sub-band to a threshold energy value and, based on the comparison for each sub-band, determine parameters for an equalization filter for processing the sub-band. The equalizer circuit is configured to receive the audio signal as an input concurrently with reception of the audio signal by the analyzer circuit, obtain the plurality of sub-bands of the audio signal using the plurality of equalization filters, receive the parameters for the plurality of equalization filters from the analyzer circuit, equalize each sub-band by applying the parameters corresponding to the sub-band, and generate an output audio signal that includes the equalized sub-bands.

Particular implementations may include one or more of the following features. The audio processing circuit may be configured to be included in a speaker device, and wherein the plurality of sub-bands of the audio signal may correspond to a plurality of resonance frequency components of the speaker device, the resonance frequency components based on one or more of a displacement transfer function of a speaker driver and speaker device enclosure, or a far-field sound pressure level (SPL) transfer function. The plurality of resonance frequency components may include a primary resonance frequency and one or more secondary resonance frequencies.

A number of the energy detector units and a number of the equalization filters may correspond to a number of the sub-bands of the audio signal. Each of the sub-bands of the audio signal may be associated with a distinct one of the energy detector units and a distinct one of the equalization filters. A magnitude response of an equalization filter associated with a sub-band may be reciprocal of a magnitude response of one or more analysis filters included in a corresponding energy detector unit associated with the sub-band. A transfer function of an equalization filter associated with a sub-band may have one or more denominator coefficients that are same as one or more denominator coefficients of one or more analysis filters included in a corresponding energy detector unit associated with the sub-band.

An equalization filter associated with a sub-band may include one of a shelf filter when the sub-band corresponds to a lowest sub-band of the audio signal, a notch filter when the sub-band corresponds to a higher-order sub-band of the audio signal, or a notch filter when the sub-band corresponds to a lowest sub-band of the audio signal. Magnitude responses of an analysis filter and an equalization filter associated with a particular sub-band may be matched in shape and extent to a complex of one or more loudspeaker resonances within that sub-band.

At least one of the energy detector units may comprise an analysis filter configured to obtain a specified sub-band of the audio signal based on frequency parameters provided to the analysis filter; an energy measurement circuit configured to measure an energy associated with the specified sub-band; and a parameter mapping circuit. The parameter circuit may be configured to compare the measured energy to a threshold energy value corresponding to the specified sub-band; based on the comparison, determine a level of signal energy attenuation for the specified sub-band; and provide parameters corresponding to the level of signal energy attenuation to an equalization filter that is associated with the specified sub-band.

The level of signal energy attenuation may be based on an amount by which the energy associated with the specified sub-band exceeds the corresponding threshold energy value. The frequency parameters may include one or more of a center frequency or bandwidth corresponding to the specified sub-band. One or more of the frequency parameters or the threshold energy value may be programmable by a user of the audio processing circuit.

The parameter mapping circuit may comprise a smoothing filter configured to reduce noise associated with the specified sub-band; an attack and release filter configured to determine the level of signal energy attenuation for the specified sub-band based on the comparison to the threshold energy value; and an energy-to-weight mapping circuit configured to determine the parameters corresponding to the level of signal energy attenuation. The parameters determined by the energy-to-weight mapping circuit may include one or more of: a weighting parameter corresponding to the level of signal energy attenuation, or time varying coefficients for a magnitude response of the equalization filter that is associated with the specified sub-band.

The analysis filter may include a bandpass filter.

The plurality of equalization filters may be arranged in series. An equalization filter may comprise a linear filter configured to receive the audio signal as an input; obtain a specified sub-band of the audio signal that corresponds to frequency parameters provided to the linear filter; receive time-varying parameters corresponding to the specified sub-band from an energy detector unit associated with the specified sub-band; manipulate a magnitude response of the linear filter based on the time-varying parameters; attenuate energy of the specified sub-band based on the manipulation of the magnitude response of the linear filter; and output the audio signal with the energy of the specified sub-band attenuated.

The frequency parameters may include one or more of a center frequency or bandwidth corresponding to the specified sub-band. The time-varying parameters may include one or more of a weighting parameter corresponding to a level of signal energy attenuation for the specified sub-band, or coefficients for the magnitude response of the linear filter, wherein the coefficients are determined based on a measurement of energy of the specified sub-band by the energy detector unit associated with the specified sub-band.

The linear filter may include a notch filter. A depth of the notch filter may be based on the time-varying parameters corresponding to the specified sub-band.

In another general aspect, an audio signal is received at an audio processing circuit. The audio signal is provided to an analyzer circuit and an equalizer circuit included in the audio processing circuit. A plurality of sub-bands of the audio signal are obtained using a plurality of energy detector units included in the analyzer circuit. Energy of each sub-band is measured using the energy detector units. The energy of each sub-band is compared to a threshold energy value using the energy detector units. Based on the comparison for each sub-band, parameters corresponding to each sub-band are sent to the equalizer circuit.

The plurality of sub-bands of the audio signal are obtained using a plurality of equalization filters included in the equalizer circuit. The parameters corresponding to each sub-band are received at the equalizer circuit from the analyzer circuit. Magnitude responses of the equalization filters are modified based on the parameters received from the analyzer circuit. The sub-bands are equalized using the modified magnitude responses of the equalization filters. An output audio signal is generated that includes the equalized sub-bands.

Particular implementations may include one or more of the following features. A number of the energy detector units and a number of the equalization filters may correspond to a number of the sub-bands of the audio signal. Each of the sub-bands of the audio signal may be associated with a distinct one of the energy detector units and a distinct one of the equalization filters.

A magnitude response of an equalization filter associated with a sub-band may be reciprocal of a magnitude response of one or more analysis filters included in a corresponding energy detector unit associated with the sub-band. A transfer function of an equalization filter associated with a sub-band may have one or more denominator coefficients that are same as one or more denominator coefficients of one or more analysis filters included in a corresponding energy detector unit associated with the sub-band.

Comparing the energy of each sub-band to a threshold energy value may comprise determining, by an energy detector unit associated with a specified sub-band, a level of signal energy attenuation for the specified sub-band based on an amount by which the energy associated with the specified sub-band exceeds a corresponding threshold energy value. The energy detector unit may compute one or more of a weighting parameter corresponding to the level of signal energy attenuation, or time-varying coefficients for a magnitude response of an equalization filter that is associated with the specified sub-band. The energy detector unit may send one or more of the weighting parameter or the time-varying coefficients to the equalization filter.

The equalization filter may receive one or more of the weighting parameter or the time-varying coefficients from the energy detector unit. The equalization filter may modify a magnitude response of the equalization filter based on the time-varying coefficients. The specified sub-band may be processed by the equalization filter, wherein the processing may comprise equalizing the specified sub-band based on the modified magnitude response of the equalization filter.

The audio processing circuit may be configured to be included in a speaker device. The plurality of sub-bands of the audio signal may be based on determining a plurality of resonance frequency components of the speaker device using one or more of a displacement transfer function of a speaker driver and speaker device enclosure, or a far-field sound pressure level (SPL) transfer function.

In another general aspect, an audio device comprises a speaker driver and an audio processing circuit, which is configured to provide an equalized audio signal to the speaker driver. The audio processing circuit comprises an analyzer circuit comprising a plurality of energy detector units, and an equalizer circuit comprising a plurality of equalization filters, the equalizer circuit being coupled with the analyzer circuit. The analyzer circuit is configured to receive an audio signal as an input, obtain a plurality of sub-bands of the audio signal using the plurality of energy detector units, measure energy of each sub-band, compare the energy of each sub-band to a threshold energy value, and based on the comparison for each sub-band, determine parameters for an equalization filter for processing the sub-band. The equalizer circuit is configured to receive the audio signal as an input concurrently with reception of the audio signal by the analyzer circuit, obtain the plurality of sub-bands of the audio signal using the plurality of equalization filters, receive the parameters for the plurality of equalization filters from the analyzer circuit, equalize each sub-band by applying the parameters corresponding to the sub-band, and provide, to the speaker driver, the equalized audio signal that includes the equalized sub-bands.

Particular implementations may include one or more of the following features. The audio device may comprise a portable Bluetooth loudspeaker. The plurality of sub-bands of the audio signal may correspond to a plurality of resonance frequency components of the audio device. The resonance frequency components may be based on one or more of a displacement transfer function of the speaker driver and speaker device enclosure, or a far-field sound pressure level (SPL) transfer function.

A number of the energy detector units and a number of the equalization filters may correspond to a number of the sub-bands of the audio signal. Each of the sub-bands of the audio signal may be associated with a distinct one of the energy detector units and a distinct one of the equalization filters. A magnitude response of an equalization filter associated with a sub-band may be reciprocal of a magnitude response of one or more analysis filters included in a corresponding energy detector unit associated with the sub-band.

At least one of the energy detector units may comprise an analysis filter configured to obtain a specified sub-band of the audio signal based on frequency parameters provided to the analysis filter; an energy measurement circuit configured to measure an energy associated with the specified sub-band; and a parameter mapping circuit.

The parameter mapping circuit may be configured to compare the measured energy to a threshold energy value corresponding to the specified sub-band; based on the comparison, determine a level of signal energy attenuation for the specified sub-band; and provide parameters corresponding to the level of signal energy attenuation to an equalization filter that is associated with the specified sub-band. The level of signal energy attenuation may be based on an amount by which the energy associated with the specified sub-band exceeds the corresponding threshold energy value.

The plurality of equalization filters may be arranged in series. An equalization filter may comprise a linear filter, which may be configured to receive the audio signal as an input; obtain a specified sub-band of the audio signal that corresponds to frequency parameters provided to the linear filter; receive time-varying parameters corresponding to the specified sub-band from an energy detector unit associated with the specified sub-band; manipulate a magnitude response of the linear filter based on the time-varying parameters; attenuate energy of the specified sub-band based on the manipulation of the magnitude response of the linear filter; and output the audio signal with the energy of the specified sub-band attenuated.

The time-varying parameters may include one or more of a weighting parameter corresponding to a level of signal energy attenuation for the specified sub-band, or coefficients for the magnitude response of the linear filter, wherein the coefficients are determined based on a measurement of energy of the specified sub-band by the energy detector unit associated with the specified sub-band.

Implementations of the above techniques include systems, methods and computer program products. Such computer program products can be suitably embodied in a non-transitory machine-readable medium that stores instructions executable by one or more processors. The instructions are configured to cause the one or more processors to perform the above-described actions. One such system includes an audio device with an enclosure comprising a driver and an audio processing circuit, where the latter is configured to perform the above actions.

In some implementations, the audio processing circuit is implemented on a low-cost digital signal processor, which can be integrated on the same die as a high-performance audio codec. In some implementations, the audio processing circuit enables the power output of the associated audio device to be maximized for a given driver and enclosure design of the audio device. The analysis and equalization parameters used by the audio processing circuit can be tuned by an engineer of the audio device during a design phase of the device. This is used to design an audio device with improved power output and robustness, and low distortion, in some implementations. In some implementations, the perceived loudness of the audio device is also enhanced, or multi-band, frequency-selective dynamic range compression is realized, or both. The audio processing circuit can lead to reduced cost and higher perceived audio quality, relative to the price point of an audio device, or across an entire product line of audio devices.

The details of one or more disclosed implementations are set forth in the accompanying drawings and the description below. Other features, aspects, and advantages will become apparent from the description, the drawings and the claims.

DETAILED DESCRIPTION

Figure 1:
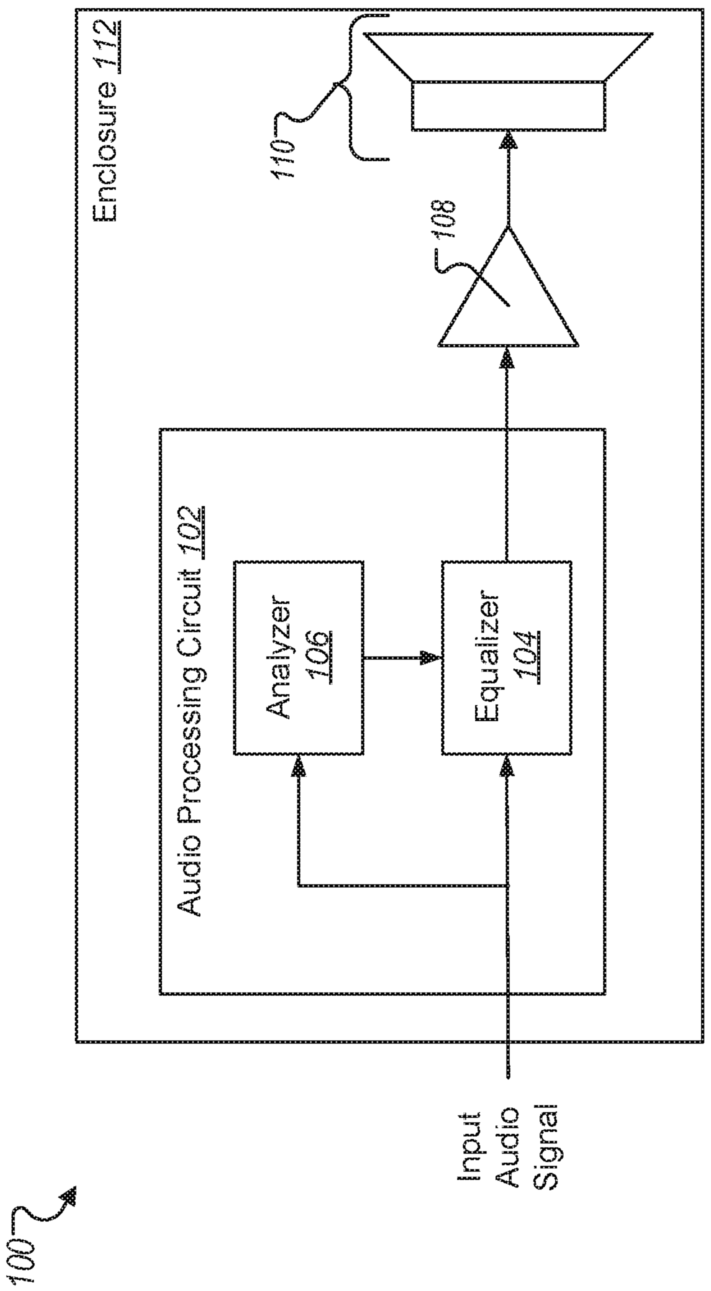
FIG. 1 illustrates an example of an audio device with an audio processing circuit for equalizing an audio signal based on concurrent energy detection of the audio signal, according to one or more implementations.

Audio speaker devices, such as loudspeakers, are used to produce sound, corresponding to input audio signals, for users to listen to. One or more drivers in an audio device generate sound waves based on the input audio signals. In some cases, a driver produces sound pressure levels that are inadequate for generating sound with sufficient loudness and clarity needed for the listener's comprehension. This can be the case, for example, at low frequencies and/or when the size of a driver is small. In such cases, various enclosure features, such as a passive radiator or tuned port, are employed in the audio device to improve the bass response of the device. The enclosure features can create resonances, which can make the driver more susceptible to damage. For example, in high drive conditions, the resonances can be strongly excited, which can cause excessive movement of the physical parts of the driver and thereby potentially lead to damage of the driver.

As an illustrative example, a portable audio device, such as a portable loudspeaker, can include one or more drivers that are in the range of 40 to 60 millimeters (mm) in diameter. A driver in this context refers to an electromechanical acoustic device that includes one or more of a permanent magnet, with a soft iron core to route the magnetic flux appropriately, a voice coil (which is driven by the power amplifier), a voice coil former, a mechanical suspension (e.g., spider, frame), a cone (e.g., diaphragm), and a dust cap, among other components. One or more drivers are housed in an enclosure of the audio device, which can also include tuned ports, passive radiators, and passive or active crossover networks, among other components. For such an audio device, a high drive condition can correspond to an audio signal energy with a root mean square voltage in the range of 18 to 20 volts (V). At such levels, a listener can hear some nonlinearity from the loudspeaker, and beyond this range, the driver can be damaged if the input audio signal has significant energy in the vicinity of one or more of the driver/device enclosure resonance frequencies. In such cases, due to the high energy of the input audio signal, for frequencies of the audio signal that correspond to resonance frequencies of the driver/device enclosure, the moving parts of the driver (e.g., the cone) can be physically displaced beyond a normal operating displacement range of the driver, thereby causing damage to the driver, e.g., by warping or tearing the cone, or loss of rigidity of the cone structure.

In this context, resonance refers to a physical phenomenon in which the energy of the input audio signal causes the speaker driver to oscillate with greater amplitude at one or more specific preferential frequencies included in the audio signal. The frequencies of the input audio signal at which the amplitude of the response of the driver (e.g., the oscillation of the driver) is a relative maximum are referred to as the resonance frequencies or resonance frequency components. Each resonance frequency component is associated with a different sub-band of the frequency spectrum of the audio signal. For example, each resonance frequency component of the audio signal corresponds to the center frequency of a sub-band. A sub-band in this context refers to a portion of the frequency spectrum of an audio signal that is characterized by a center frequency and a bandwidth, e.g., a range of the frequency spectrum around the center frequency. Each sub-band of the audio signal that is processed includes a center frequency matching a resonance frequency component of the speaker driver, and a bandwidth that covers a specified range of the frequency spectrum of the audio signal around the center frequency.

The following sections describe an audio processing circuit that employs techniques, such as active equalization of the sub-bands of the input audio signal, to manage the energy level of the audio signal that is provided to a speaker driver. The active equalization is performed in real time based on concurrent energy measurement of the sub-bands on the audio signal along a second signal path. By managing the power provided to the driver in this manner, the audio processing circuit protects the driver from damage under high drive conditions, e.g., when high signal energy levels are associated with the resonance frequency components of the input audio signal.

FIG. 1 illustrates an example of an audio device 100 with an audio processing circuit for equalizing an audio signal based on concurrent energy detection of the audio signal, according to one or more implementations. The audio device 100 includes an audio processing circuit 102, a power amplifier 108, a driver 110, and an enclosure 112. The audio processing circuit includes an equalizer circuit 104 and an analyzer circuit 106.

In some implementations, the audio device 100 represents a portion of a speaker system. For example, the audio device 100 can be one channel, such as the left channel or the right channel, of a speaker system that is used to play back audio from a playback device, such as a multimedia player. In some implementations, the speaker system includes a portable loudspeaker. For example, in some implementations, the audio device 100 is a portion of a portable Bluetooth™ loudspeaker or Bluetooth™ headphones.

As shown, the components of the audio device 100, such as the audio processing circuit 102, the power amplifier 108 and the driver 110, among others, are included in the enclosure 112. In some implementations, the audio device 100 represents a portion of a portable loudspeaker and the enclosure 112 is an ear cup. In some implementations, the enclosure 112 includes a printed circuit board (PCB) hardware implementing the audio processing circuit 102, the power amplifier 108, the driver 110 and a battery and charging circuit. In the case of portable Bluetooth™ loudspeakers, the enclosure 112 also includes a Bluetooth™ system on a chip (SoC).

In some implementations, the audio processing circuit 102 is implemented using a programmable digital signal processor (DSP). Instructions corresponding to the functions of the audio processing circuit 102 are encoded as firmware in the DSP. However, in other implementations, the audio processing circuit 102 is implemented in some other suitable manner, e.g., as an integrated circuit (IC) in which circuit elements, such as components of the equalizer circuit 104 and the analyzer circuit 106 are electrically interconnected to perform the operations of the audio processing circuit 102.

As shown, an audio signal, e.g., a digital audio stream, which is input to the audio device 100, is forwarded to the audio processing circuit 102. The audio processing circuit 102 splits the input audio signal into two signal paths—a first signal path that forwards the audio signal to an equalizer circuit 104 and a second signal path that forwards the audio signal to an analyzer circuit 106. In some implementations, the audio signal is forwarded to the equalizer circuit 104 and the analyzer circuit 106 concurrently.

The equalizer circuit 104 includes one or more filter units to process the audio signal. The filter units equalize the audio signal, e.g., by removing excess signal energy from one or more sub-bands of the audio signal. The filter units equalize the audio signal using attenuation parameters that are provided by the analyzer circuit 106.

The analyzer circuit 106 analyzes the input audio signal to effect real time adjustment of the audio signal by the equalizer circuit 104. The analyzer circuit 106 includes a bank of energy detector units, comprising one or more filters, which decomposes the input audio signal into a certain number of sub-band signals to measure the short-term energy in each sub-band. For example, as described in greater detail below, in some implementations, the input audio signal is decomposed into three sub-band signals. In some other implementations, the input audio signal is decomposed into a different number of sub-band signals, such as two, four, five, or some other suitable number.

By measuring the energy in each sub-band, the analyzer circuit 106 determines attenuation parameters for the filter units in the equalizer circuit 104. The attenuation parameters are forwarded to filter units in the equalizer circuit 104, which use the attenuation parameters to equalize the sub-bands of the audio signal, e.g., when the measured energy of a sub-band is greater than a preselected threshold energy value. In some implementations, the threshold energy value of a sub-band is selected to correspond to an energy level that is within a safe operating range of the audio device, e.g., to avoid damage to the speaker driver under high drive conditions for the sub-band of the audio signal.

In some implementations, the magnitude responses of the energy detector units in the analyzer circuit 106 are complimentary to the magnitude responses of the filter units in the equalizer circuit 104. These filters are complimentary in the sense that they are derived from the same prototype filter structure, and have the same denominator coefficients. In this manner, by measuring the short-term energy of the sub-bands, the analyzer circuit 104 continually modifies the response of the equalizer circuit 106 while processing an audio signal. The equalizer circuit 104 and the analyzer circuit 106 are described in greater detail in the following sections.

The output of the audio processing circuit 102 is an equalized audio signal, e.g., an audio signal in which the excess energy of each sub-band of the audio signal that is greater than a preselected threshold energy value for the sub-band has been attenuated. The equalized audio signal is provided to one or more other components of the audio device 100. In some implementations, the equalized audio signal is provided to the power amplifier 108, e.g., to amplify low-power audio signals in the human range of hearing, which includes signals in a frequency range between 20 Hertz (Hz) and 20000 Hz (20 Kilohertz or KHz). In some implementations, the power amplifier 108 is a class D amplifier. The power amplifier 108 increases the power of low-power audio signals to a level that is strong enough for driving the driver 110 to produce sound at levels that are audible to listeners. The amplified audio signal output by the power amplifier 108 is used to drive the driver 110 to produce the desired sound.

Figure 2A:
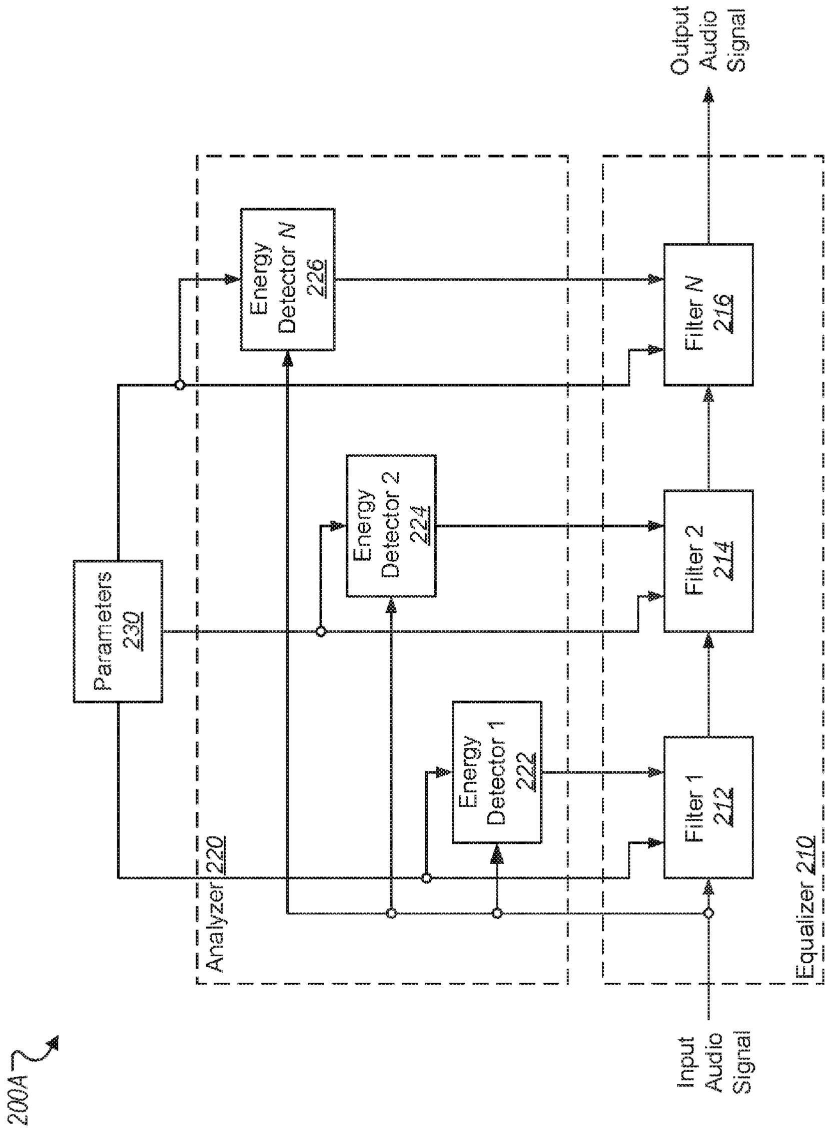
FIGS. 2A and 2B illustrate examples of audio processing circuits for equalizing of an audio signal based on concurrent energy measurement of the audio signal, according to one or more implementations.
Figure 2B:
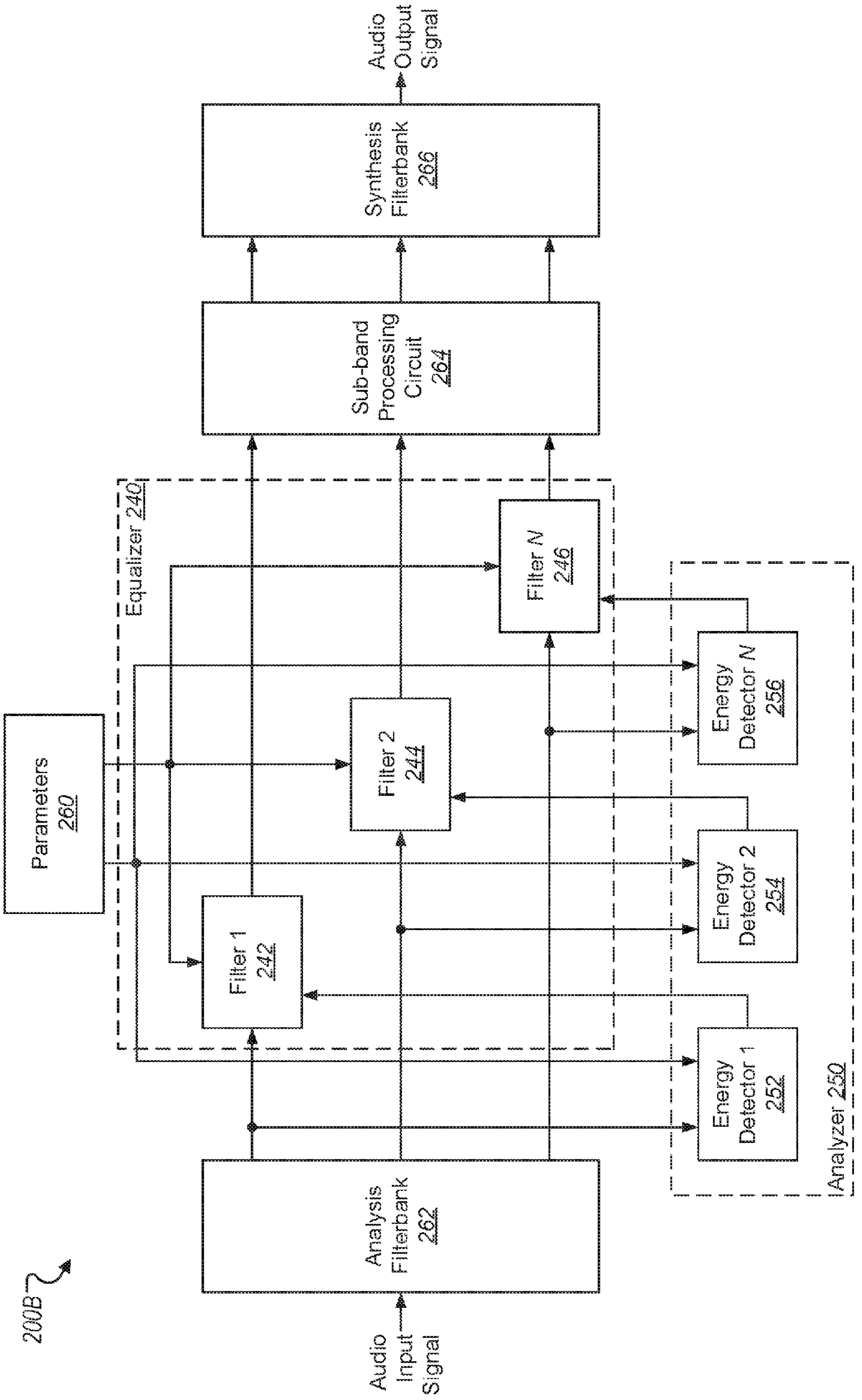

FIGS. 2A and 2B illustrate examples of audio processing circuits 200A and 200B respectively for equalizing an audio signal based on concurrent energy measurement of the audio signal, according to one or more implementations. The audio processing circuit 200A of FIG. 2A illustrates an example implementation in which the equalizer filter units are arranged in cascade, while the audio processing circuit 200B of FIG. 2B illustrates an example implementation in which the equalizer filter units are arranged in parallel.

As shown in FIG. 2A, the audio processing circuit 200A includes an equalizer circuit 210, an analyzer circuit 220 and a parameters unit 230. The equalizer circuit 210 includes N equalizer filter units (N is an integer>0), such as filter 1 212, filter 2 214 and filter N 216. The analyzer circuit 220 includes N energy detector units, such as energy detector 1 222, energy detector 2 224 and energy detector N 226.

As shown in FIG. 2B, the audio processing circuit 200B includes an equalizer circuit 240, an analyzer circuit 250, a parameters unit 260, an analysis filterbank 262, a sub-band processing circuit 264 and a synthesis filterbank 266. The equalizer circuit 240 includes N equalizer filter units (N is an integer>0), such as filter 1 242, filter 2 244 and filter N 246. The analyzer circuit 250 includes N energy detector units, such as energy detector 1 252, energy detector 2 254 and energy detector N 256.

Considering the audio processing circuit 200A, in some implementations, the audio processing circuit 200A is similar to the audio processing circuit 102. The equalizer circuit 210 is similar to the equalizer circuit 104 and the analyzer circuit 220 is similar to the analyzer circuit 106. In some implementations, the audio processing circuit 200A is included in, or otherwise coupled to, an audio device. e.g., the audio device 100.

The N filter units in the equalizer circuit 210 are used to equalize an input audio signal. The example audio processing circuit 200A shows an implementation with three filter units (N=3). In some implementations, the number N corresponds to the number of frequency sub-bands of the audio signal processed by the audio processing circuit 200A. For example, in some implementations, the audio processing circuit 200A is configured to equalize signal energy levels associated with a primary resonance frequency and two secondary resonance frequencies (also called "passive resonance" frequencies) of an audio signal. These three resonance frequency components correspond to three sub-bands of the audio signal, e.g., a first sub-band with a center frequency and bandwidth corresponding to the primary resonance frequency component, a second sub-band with a center frequency and bandwidth corresponding to the first secondary resonance frequency component, and a third sub-band with a center frequency and bandwidth corresponding to the second secondary resonance frequency component. In such implementations, the equalizer circuit 210 includes three filter units.

In some implementations, the N sub-bands of the audio signal and their corresponding parameters are determined based on instructions provided by a user of the audio device corresponding to the audio processing circuit 200A. For example, in some implementations, a development environment, which consists of appropriate hardware such as a computer displaying a graphical user interface, is provided to an engineer to assist with the design and prototyping process for an audio device. The hardware can be coupled to the audio processing circuit 200A, or to the audio device associated with the audio processing circuit 200A. During a design phase of the audio device, the engineer analyzes the driver and the enclosure of the audio device and the surrounding acoustic environment to determine N resonance frequencies that affect the driver and the enclosure of the audio device. The engineer enters the parameters of N sub-bands corresponding to these determined resonance frequencies, which are to be processed by the audio processing circuit 200A. For example, the engineer can specify that the audio processing circuit 200A should process three sub-bands that correspond to a primary resonance frequency component and two secondary resonance frequency components, and enters the center frequency and bandwidth of each sub-band. Accordingly, the audio processing circuit 200A is configured to process three sub-bands of an input audio signal (N=3). In a manner similar to the above, different implementations of the audio processing circuit can be configured to process different number of sub-bands of an input audio signal, such as N=2, 4, 6, or some other suitable number.

The engineer can specify the parameters of the sub-bands by entering through an input system, e.g., through the computer displaying the graphical user interface. In such implementations, the number N of sub-bands is fixed and correspondingly, the N number of filter units and the N number of energy detector units are also fixed.

In some implementations, the parameters of the N sub-bands of the audio signal are dynamically determined. For example, the audio processing circuit 200A can be configured to analyze the characteristics of the driver and/or the enclosure of the audio device and the surrounding acoustic environment to determine the resonance frequencies for the driver and/or the enclosure of the audio device, and accordingly determine the sub-band parameters.

In such implementations, the equalizer circuit 210 and the analyzer circuit 220 are implemented with a certain maximum number of filter units and energy detector units, respectively. The audio processing circuit 200A uses different subsets of the filter units and the energy detector units, depending on the number of resonance frequencies that are dynamically determined, which is limited by the maximum number of filter units and energy detector units that are implemented. The maximum number of filter units and energy detector units (e.g., a maximum value of N) depends on the various physical and computing constraints of the audio processing circuit 200A, such as the computing power of a DSP that implements the audio processing circuit 200A or the amount of physical memory available in the DSP to store instructions and data corresponding to the various components of the audio processing circuit 200A.

In some implementations, the N filter units of equalizer circuit 210 are arranged in cascade, e.g., in series, with the output of one filter unit being provided as an input to the next filter unit. For example, as shown, the output of filter 1 212 is provided as an input to filter 2 214, while the output of filter 2 214 is provided as an input to filter N 216. A series structure of this type performs independent processing of adjacent frequency bands within the audio spectrum, inasmuch as the gain (e.g., the magnitude response) of each particular equalizer section is either approximately or exactly 1 outside the boundaries of the sub-band it services.

In some implementations, each filter unit is configured to process a sub-band that is different from another sub-band processed by another filter unit. For example, in some implementations the first filter unit filter 1 212 is configured based on the center frequency and bandwidth, among other parameters, of the sub-band corresponding to the primary resonance frequency component; the second filter unit filter 2 214 is configured based on the center frequency and bandwidth of the sub-band corresponding to the first secondary resonance frequency component; and the third filter unit filter N 216 is configured based on the center frequency and bandwidth of the sub-band corresponding to the second secondary resonance frequency component. In such implementations, filter 1 212 equalizes the signal energy of the sub-band of the audio signal corresponding to the primary resonance frequency component, filter 2 214 equalizes the signal energy of the sub-band of the audio signal corresponding to first secondary resonance frequency component, and filter N 216 equalizes the signal energy of the sub-band of the audio signal corresponding to second secondary resonance frequency component.

In some implementations, each filter unit in the equalizer circuit 210 is coupled to a specific energy detector unit in the analyzer circuit 220. For example, in some implementations the energy detector 1 222 is configured based on, among other parameters, the center frequency and bandwidth of the sub-band corresponding to the primary resonance frequency component, which are the sub-band parameters using which filter 1 212 is configured as described above. The energy detector 2 224 is configured based on the center frequency and bandwidth of the sub-band corresponding to the first secondary resonance frequency component, which are the sub-band parameters using which filter 2 214 is configured as described above. The energy detector N 226 is configured based on the center frequency and bandwidth of the sub-band corresponding to the second secondary resonance frequency component, which are the sub-band parameters using which filter N 216 is configured as described above.

In such implementations, energy detector 1 222 measures the signal energy of, and determines attenuation parameters for the sub-band of the audio signal corresponding to the primary resonance frequency component. The energy detector 1 222 is coupled to the first filter unit filter 1 212, and outputs the determined attenuation parameters to filter 1 212, which uses the attenuation parameters to equalize the signal energy of the sub-band of the audio signal corresponding to the primary resonance frequency component. Similarly, the energy detector 2 224 measures the signal energy of, and determines attenuation parameters for the sub-band of the audio signal corresponding to the first secondary resonance frequency component. The energy detector 2 224 is coupled to the second filter unit filter 2 214, and outputs the determined attenuation parameters to the filter 2 214, which is configured to equalize the first secondary resonance frequency component. The energy detector N 226 measures the signal energy of, and determines attenuation parameters for, the sub-band of the audio signal corresponding to the second secondary resonance frequency component. The energy detector N 226 is coupled to the third filter unit filter N 216, and outputs the determined attenuation parameters to the filter N 216, which is configured to equalize the second secondary resonance frequency component.

Accordingly, as described above, each filter unit and energy detector unit processes a certain sub-band of the audio signal, which is based on the sub-band parameters that are provided to the filter and energy detector units, e.g., the center frequency and bandwidth of each sub-band. In some implementations, these sub-band parameters are stored in the parameters unit 230. As noted previously, the center frequency and bandwidth parameters are selected in advance, e.g., either by an engineer or dynamically determined by the audio processing circuit 200A upon analyzing the characteristics of the driver, enclosure and surrounding acoustic environment of the audio device, prior to performing the equalization operations on an input audio signal. By knowing the center frequency and bandwidth parameters in advance before processing an audio signal, each pair of a filter unit and a corresponding energy detector unit is configured to process a specific sub-band to equalize the energy in the associated sub-band due to the processing. In such implementations, the center frequency and bandwidth parameters are referred to as fixed parameters of the equalizer circuit 210 and the analyzer circuit 220. As noted below, although the associated sub-band is determined based on the fixed parameters, each filter unit utilizes other time-varying parameters to equalize the energy in the associated sub-band, which can vary in similar sub-bands for different input audio signals.

In some implementations, the parameters unit 230 includes storage memory, e.g., Electrically Erasable Programmable Read-Only Memory (EEPROM) or flash memory associated with the DSP or IC that is used to implement the audio processing circuit 200A. In some implementations, the parameters unit 230 includes some other suitable storage device, e.g., a hard drive, that is coupled to the DSP or IC implementing the audio processing circuit 200A.

In addition to the fixed parameters of each sub-band, e.g., center frequency and bandwidth, each filter unit in the equalizer circuit 210 also uses the time-varying parameters that are provided by the energy detector units in the analyzer circuit 220. As noted above, in some implementations, the equalizer circuit 210 and the analyzer circuit 220 process the input audio signal concurrently as the signal is forwarded to the two circuits along the two signal paths. As described in greater detail in the following sections, each energy detector unit determines, based on measuring the signal energy of the associated sub-band, time-varying parameters that are used by the corresponding filter unit to equalize the associated sub-band. For different input audio signals, an energy detector unit can determine different values of the time-varying parameters, e.g., depending on the energy level of the sub-band in the current audio signal.

In some implementations, each energy detector unit compares the measured energy of the corresponding sub-band to a threshold energy value to determine the time-varying parameters for the sub-band. The threshold energy value of a sub-band is preselected, e.g., by an engineer of the audio device, to ensure the safety of the speaker driver under high drive conditions. In some implementations, different threshold energy values are preselected for different sub-bands. In other implementations, a common threshold energy value is used for the different sub-bands. The threshold energy value or values are programmed into storage memory associated with the audio processing circuit 200A, e.g., as part of the parameters unit 230.

In some implementations, a filter unit, e.g., filter 1 212, in the equalizer circuit 210 applies a time-varying linear equalization on the corresponding sub-band of the input audio signal based on receiving the time-varying parameters from the associated energy detector unit, e.g., energy detector 1 222, in the analyzer circuit 220. When the short-term energy within the sub-band exceeds the threshold energy value for the sub-band, frequency-dependent attenuation is applied by adjusting the magnitude response of the filter unit based on the time-varying parameters of the corresponding transfer function. The amount of attenuation depends directly on the amount by which the short-term energy exceeds the corresponding threshold energy value. Accordingly, since the time-varying parameters are determined based on measuring the sub-band signal energy, the shape of the filter unit is a function of the signal energy in the corresponding sub-band, e.g., the signal energy in the vicinity of the resonance frequency component associated with the sub-band. Additionally or alternatively, in some implementations, shape of the filter unit is a function of the total signal energy.

In some implementations, the relationship between the excess energy in a sub-band and the attenuation applied to the sub-band is linear. In other implementations, the relationship between the excess energy and the applied attenuation follows some other suitable function, such as quadratic. The short-term magnitude response of a filter unit varies smoothly as a function of the amount by which the corresponding sub-band energy exceeds its associated threshold energy value.

In some implementations, at lower drive levels, e.g., when the measured energy of a sub-band is below the associated threshold energy value, the operation of the corresponding filter unit is completely transparent, e.g., no magnitude shaping or attenuation is applied to the corresponding sub-band. In such cases, the sub-band has unity gain.

In some implementations, each energy detector unit includes one or more analysis filters that are used to decompose the input audio signal into the N constituent sub-band signals to measure the short-term energy in each of the sub-bands. In such implementations, the magnitude response of the filter unit associated with a sub-band, e.g., filter 1 212, is related to the magnitude response of the analysis filter in the corresponding energy detector, energy detector 1 222. For example, the numerator coefficients of the transfer function of a filter unit is the reciprocal of the numerator coefficients of the transfer function of the analysis filter in the corresponding energy detector unit. This can ensure parsimonious equalization of the audio signal, e.g., the amount of attenuation introduced by the filter unit at high drive levels is minimized.

In some implementations, the analysis filters include bandpass filters whose specific shapes (e.g., magnitude responses) are tuned to key characteristics of the driver, the enclosure, and the nearby acoustic environment of the audio device. For example, the characteristics to which the analysis filters are specifically matched include the displacement transfer function of the driver and the enclosure, and the far-field sound pressure level (SPL) transfer function. The parameters of the filter units and the analysis filters are determined using SPL measurements. This can be achieved, for example, using a nonlinear optimization algorithm embedded within the audio processing circuit 200A. In some implementations, the mid-band portion of the SPL transfer function is used for the actual displacement transfer function. In conjunction with the mid-band SPL measurements, the displacement transfer function of the driver and the enclosure are estimated using voltage and current measurements in some implementations.

In some implementations, each filter unit includes a linear, time-varying filter that equalizes a sub-band corresponding to the filter unit. The overall transfer function of the time-varying equalizer circuit 210 includes the product of the transfer functions of the N filter units filter 1 212, filter 2 214 and filter N 216, where N is the number of sub-bands of the audio signal that are analyzed using the corresponding energy detector units energy detector 1 222, energy detector 2 224 and energy detector N 226. In some implementations, the time-varying linear equalization is combined with single-band Dynamic Range Compression (DRC).

In some implementations, the analysis filters included in the energy detector units include an approximation of a perfect reconstruction filterbank, e.g., pseudo-QMF (quadrature mirror filter) filterbank. In such implementations, additional processing of the individual sub-band signals can be applied before recombining the sub-band signals following equalization by the equalizer circuit 210. The additional processing can include psycho-acoustic or physical harmonic enhancement, or compensation of perceived loudness, among others.

In some implementations, the equalizer circuit 210 utilizes different forms of filter units depending on the corresponding sub-band that is processed. For example, for the lowest sub-band (e.g., sub-band 0) of the audio signal, a continuously variable shelf filter is used in some implementations, while for the upper sub-bands, continuously variable notch filters are used. In this context, a lowest sub-band refers to a sub-band of the audio signal that corresponds to the resonance frequency component with the lowest frequency, compared to other resonance frequency components.

Considering a shelf filter that is used for the lowest sub-band of the audio signal, the bandwidth parameter $\Omega_0$ of the shelf filter is given by equation (1).

$$\Omega_0 = \frac{\pi f_c}{f_s} \tag{1}$$

In equation (1), $f_c$ is the uppermost corner frequency of the shelf filter in Hz. In the development that follows, it is convenient to define $\Omega_0$ by normalizing $f_c$ to twice the sampling frequency $f_s$ in Hz. The shelf filter suppresses the signal energy level at frequencies of the input audio signal that are below the shelf frequency, such that the energy level of the lowest sub-band is within the threshold energy value associated with the sub-band.

In normalizing the denominator coefficients of the shelf filter described below so that the leading coefficient $a_0$ is unity, as given in equation (3a), the coefficients are divided by a common scale factor $d_0$, where.

$$d_0 = 1 + \sqrt{2}\cdot\Omega_0 + \Omega_0^2 \tag{2}$$

The denominator coefficients for the transfer function of the shelf filter, are then given by equations (3a), (3b) and (3c)

$$a_0 = 1 \tag{3a}$$

$$a_1 = \frac{2(\Omega_0^2 - 1)}{d_0} \tag{3b}$$

$$a_2 = \frac{1 - \sqrt{2}\cdot\Omega_0 + \Omega_0^2}{d_0} \tag{3b}$$

The numerator coefficients for the transfer function of the shelf filter are modified in real time according to a weighting parameter $g_s$, which is given by equation (4).

$$g_s(e) = \begin{cases} 1 & e \le e_0 \\ \dfrac{e_0}{e} & e > e_0 \end{cases} \tag{4}$$

In equation (4), e is the normalized energy of the sub-band processed by the shelf filter and $e_0$ is the corresponding threshold energy value. As shown by equation (4), when the normalized energy of the sub-band is lower than or equal to the threshold energy value, the shelf filter does not attenuate the signal energy, such that the weighting factor is 1. As explained below, this in turn causes the gain of the shelf filter to be unity for all frequencies. In some implementations, the determination of the weighting parameter is performed by the corresponding energy detector unit, as described in the following sections.

The numerator coefficients of the transfer function of the shelf filter are given by equations (5a), (5b) and (5c).

$$b_0 = \frac{1 + \sqrt{2g_s}\cdot\Omega_0 + g_s\cdot\Omega_0^2}{d_0} \tag{5a}$$

$$b_1 = \frac{2(g_s\cdot\Omega_0^2 - 1)}{d_0} \tag{5b}$$

$$b_2 = \frac{1 - \sqrt{2g_s}\cdot\Omega_0 + g_s\cdot\Omega_0^2}{d_0} \tag{5c}$$

In comparing (3) and (5a), (5b) and (5c), when $g_s=1$, $b_0=a_0=1$, $b_1=a_1$ and $b_2=a_2$. Equivalently:

$$\left.\frac{B(z; g_s)}{A(z)}\right|_{g_s=1} = 1$$

When the uppermost corner frequency of the shelf $f_c$ is much smaller than the sampling frequency $f_s$, e.g., $f_c \ll f_s$, $d_0 \approx 1$. In such cases, equations (5a), (5b) and (5c) can be simplified as shown by equations (6a), (6b) and (6c) respectively.

$$b_0 = 1 + \sqrt{2g_s}\cdot\Omega_0 + g_s\cdot\Omega_0^2 \tag{6a}$$

$$b_1 = 2(g_s\cdot\Omega_0^2 - 1) \tag{6b}$$

$$b_2 = 1 - \sqrt{2g_s}\cdot\Omega_0 + g_s\cdot\Omega_0^2 \tag{6c}$$

Use of the filter parameters as shown by equations (6a), (6b) and (6c) reduces the implementation cost compared to the case given by equations (5a), (5b) and (5c). In some implementations, e.g., those using typical fixed-point processors, this is useful, since division cannot be performed in a single CPU cycle.

Equations (5a), (5b) and (5c) and/or equations (6a), (6b) and (6c) indicate that the weighting parameter $g_s$ is used to manipulate the transfer function of the shelf filter, and thereby manipulate the magnitude response of the shelf filter. Equation (4) indicates that the weighting parameter $g_s$ is determined based on comparing the measured energy level of the sub-band to the corresponding threshold energy value. Accordingly, the magnitude response of the shelf filter is varied based on the short-term energy measurement of the lowest sub-band by the corresponding energy detector unit.

Considering the higher order sub-bands of the input audio signal, in some implementations, the equalizer circuit 210 utilizes second-order parametric filter units with embedded programmable all-pass filters to realize notch filters for the filter units, which are used to process the higher order sub-bands. In this context, a higher order sub-band corresponds to a resonance frequency component that is different from the resonance frequency component with the lowest frequency. In some implementations, the second-order parametric filter units with embedded programmable all-pass filters are also used to realize bandpass analysis filters for the energy detector units. This can be useful, for example, to allow convenient, low-cost implementation of the filters in the filter units and the complimentary analysis filters in the energy detector units.

As noted previously, in some implementations, the N filter units of equalizer circuit 210 are arranged in cascade, e.g., in series, with the output of one filter unit being provided as an input to the next filter unit. In some implementations, the audio sub-bands may be equalized in a parallel fashion, rather than serially. An example of an audio processing circuit that performs equalization of audio sub-bands in parallel is the audio processing circuit 200B of FIG. 2B. As shown in FIG. 2B, the N equalizer filter units in the equalizer 240, e.g., filter 1 242, filter 2 244 and filter N 246, are arranged in parallel.

Each filter unit in the equalizer circuit 240 is coupled to a specific energy detector unit in the analyzer circuit 250. For example, in some implementations, the filter 1 242 is configured based on, among other parameters, the center frequency and bandwidth of the sub-band corresponding to the primary resonance frequency component, and the energy detector 1 252 is configured using the same sub-band parameters. The filter 2 244 is configured based on, among other parameters, the center frequency and bandwidth of the sub-band corresponding to the first secondary resonance frequency component, and the energy detector 2 254 is configured using the same sub-band parameters. The filter N 246 is configured based on, among other parameters, the center frequency and bandwidth of the sub-band corresponding to the second secondary resonance frequency component, and the energy detector N 256 is configured using the same sub-band parameters.

The energy detector 1 252 measures the signal energy of, and determines attenuation parameters for the sub-band of the audio signal corresponding to the primary resonance frequency component. The energy detector 1 252 is coupled to the first filter unit filter 1 242, and outputs the determined attenuation parameters to filter 1 242, which uses the attenuation parameters to equalize the signal energy of the sub-band of the audio signal corresponding to the primary resonance frequency component. Similarly, the energy detector 2 254 measures the signal energy of, and determines attenuation parameters for the sub-band of the audio signal corresponding to the first secondary resonance frequency component. The energy detector 2 254 is coupled to the second filter unit filter 2 244, and outputs the determined attenuation parameters to the filter 2 244, which is configured to equalize the first secondary resonance frequency component. The energy detector N 256 measures the signal energy of, and determines attenuation parameters for, the sub-band of the audio signal corresponding to the second secondary resonance frequency component. The energy detector N 256 is coupled to the third filter unit filter N 246, and outputs the determined attenuation parameters to the filter N 246, which is configured to equalize the second secondary resonance frequency component.

In some implementations, the components of the equalizer circuit 240 are similar to the components of the equalizer circuit 210, and the components of the analyzer circuit 250 are similar to the components of the analyzer circuit 220. In such implementations, the structure of, and operations performed by, filter 1 242 of the equalizer circuit 240 is similar to the structure of, and operations performed by, filter 1 212 of the equalizer circuit 210. The filter units filter 2 244 and filter N 246 are correspondingly similar to the filter units filter 2 214 and filter N 216. Further, the structure of, and operations performed by, energy detector 1 252 of the analyzer circuit 250 is similar to the structure of, and operations performed by, energy detector 1 222 of the analyzer circuit 220. The energy detector units energy detector 2 254 and energy detector N 256 are correspondingly similar to the energy detector units energy detector 2 224 and energy detector N 226.

The N parallel equalizer filter units, e.g., filter 1 242, filter 2 244 and filter N 246, are preceded by an analysis filterbank 262. The analysis filterbank 262 includes a bank of N appropriate sub-band decomposition filters that realize or approximate the analysis filters of a perfect reconstruction filterbank. In some implementations, a bank of pseudo-quadrature mirror filters (PQMFs) is used. Such a structure can be useful, e.g., when further sub-band processing in addition to speaker protection is desired. In such implementations, a sub-band processing circuit 264 follows the N filter units in the equalizer circuit 240. The sub-band processing circuit 264 is optionally present in some implementations. In such cases, the sub-band processing circuit 264 performs additional sub-band processing. The additional sub-band processing includes, for example, nonlinear dynamic range manipulation, such as expander-based noise suppression, in which different expanders are used for each sub-band. Additionally or alternatively, the additional sub-band processing includes sub-band-based artificial reverberation, and other audio effects.

In implementations that include the sub-band processing circuit 264, the sub-band processing circuit 264 is followed by the synthesis filterbank 266. In implementations that do not include the sub-band processing circuit 264, the equalizer circuit 240 is followed by the synthesis filterbank 266. The synthesis filterbank 266 produces the overall output audio signal by combining the parallel, processed sub-band signals using the synthesis filters of a perfect reconstruction filterbank, or an approximation of them.

In some implementations, the individual filters within the analysis filterbank 262 (e.g., the analysis filters of a PQMF filterbank) provide time-varying energy estimates on which real-time equalizer adaptation is based. In such cases, smoothing and attack/decay regulation of the raw energy estimates is provided in the same manner as in the audio processing circuit 200A.

Figure 3A:
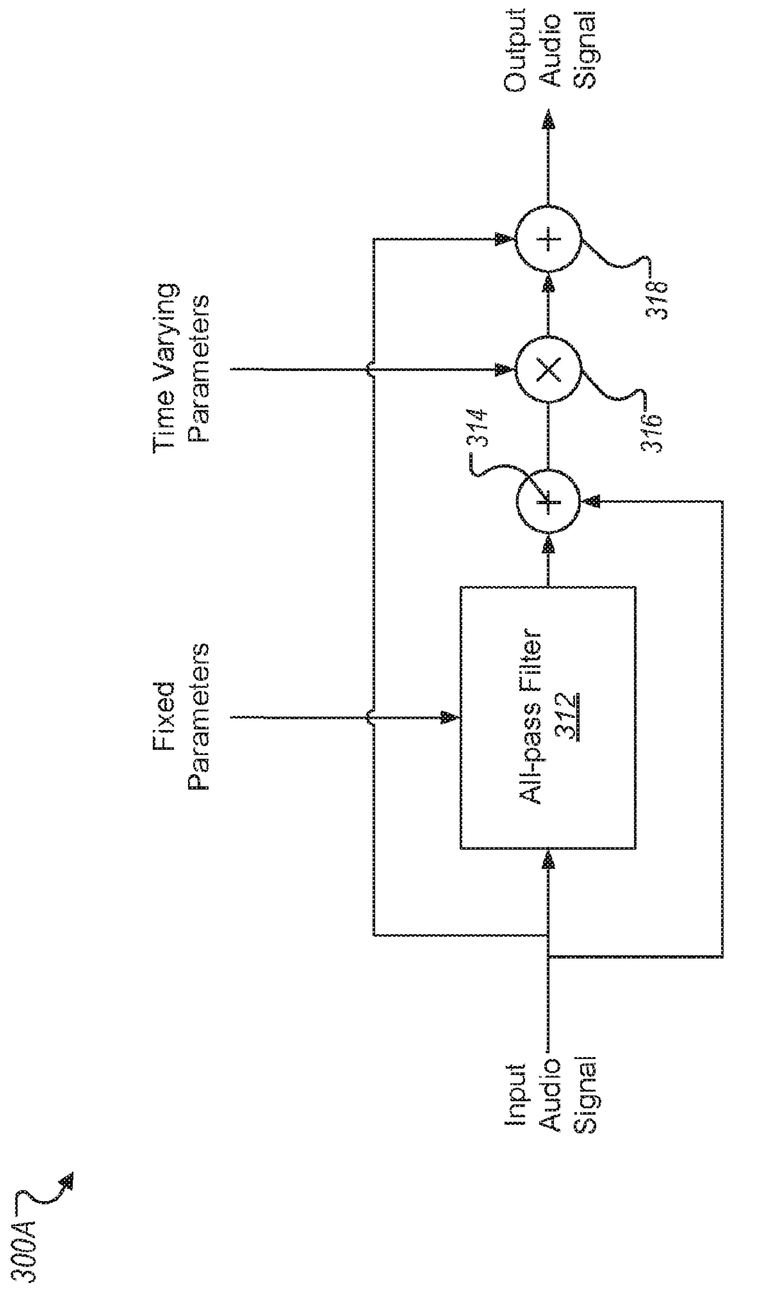
FIGS. 3A and 3B illustrate block diagrams of examples of filter units that are parts of an equalizer circuit of an audio processing circuit, according to one or more implementations.
Figure 3B:
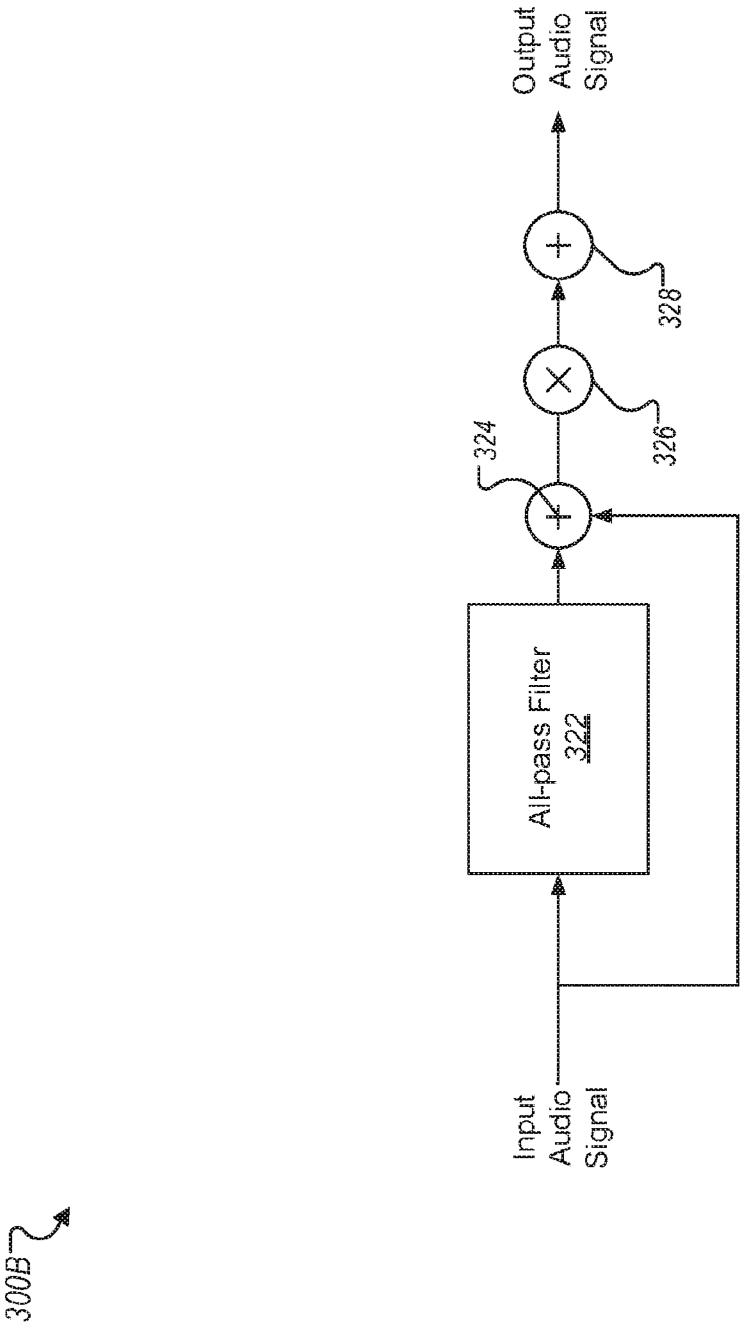

FIGS. 3A and 3B illustrate block diagrams of examples of filter units 300A and 300B respectively, that are parts of an equalizer circuit of an audio processing circuit, according to one or more implementations. The filter unit 300A shown in FIG. 3A includes an all-pass filter 312, combiners 314 and 318, and a multiplier 316. In some implementations, the filter unit 300A is a second order filter with the embedded all-pass filter 312. In some implementations, the filter unit 300A is similar to one or more of the filter units of the equalizer circuit 210, e.g., filter 1 212, filter 2 214 or filter N 216. The filter unit 300B shown in FIG. 3B includes an all-pass filter 322, combiners 324 and 328, and multiplier 326.

The filter unit 300A serves as a prototype structure from which the analysis and equalization filters for some sub-bands can be derived. The sub-band that is processed depends on fixed parameters that are used to configure the all-pass filter 312, which include, for example, the center frequency and bandwidth of the sub-band. In some implementations, the fixed parameters are supplied to the all-pass filter 312 from the parameters unit 230.

The transfer function $H_p(z)$ of the prototype or primal filter unit 300A is given by equation (7).

$$H_p(z) = 1 + \frac{H_0}{2}[1 - H_a(z)] \quad (7)$$

In equation (7), $H_a(z)$ is the transfer function of the all-pass filter 312 and $H_0$ represents a fixed or variable scale factor. In some implementations, the scale factor $$\frac{H_0}{2}$$

is provided to the multiplier 316. Equation (7) indicates that when $H_0<0$, a notch filter is formed, while for $H_0>0$, a peaking filter is formed. In some implementations. $H_0$ is a fixed gain that can be programmed into the audio processing circuit, e.g., stored in parameters unit 230.

In some implementations, a fixed bandpass filter is formed when $H_0=1$, and when the upper feedforward path of the input audio signal to the combiner 318 in the filter unit 300A is removed, yielding a degenerate form of the prototype filter. This is illustrated by the example filter unit 300B of FIG. 3B, in which the scale factor $H_0=1$ is provided to the multiplier 326. The various filter types derived from the prototype filter unit 300A—notch filter, peaking filter, or fixed bandpass filter—are complimentary in the sense that they share the same denominator. In some implementations, the analysis (energy detection) filter employs such a fixed bandpass filter 300B, and the corresponding equalizer comprises a variable notch filter having the same denominator coefficients as the bandpass filter. In other implementations, an equivalent, lower-cost implementation may be realized by altering the numerator coefficients of the notch filter directly, rather than indirectly by way of $H_0$.

In summary, at the resonance frequency of the all-pass filter 312, the phase shift of the all-pass filter 312 is 180°. The overall phase shift at this frequency is then 0. As shown by equation (7), the magnitude of the response of the filter unit in this situation is $1+H_0$, where $-1<H_0<0$ for a notch filter, and $H_0>0$ for a peaking filter. In the degenerate (bandpass) case, wherein a feedforward path is removed, the magnitude response at the all-pass resonant frequency is simply $H_0=1$. Elsewhere, the magnitude response is less than 1.

In some implementations, notch filters in the equalizer circuit 210 for the higher order sub-bands of the audio signal, and/or bandpass analysis filters in the corresponding energy detector units, are based on the filter unit 300A. For example, as described in greater detail in the following sections, a notch filter or an analysis filter is derived by using same denominator coefficients for the transfer functions of the notch filter and the corresponding analysis bandpass filter. However, the numerator coefficients for the transfer functions of the notch filters and the bandpass analysis filters are different. The numerator coefficients of the notch filter are modified in real time based on the current short-term energy measurement of the associated sub-band by the corresponding energy detector unit.

In some implementations, the fixed parameters of a notch filter used in a filter unit of the equalizer circuit 210 to process higher-order sub-bands of an input audio signal are given by equations (8)-(12), (13a)-(13c) and (14a)-(14c). These parameters of the notch filter are stored in storage memory associated with the audio processing circuit, e.g., in the parameters unit 230.

The normalized bandwidth parameter $\Omega_n$ of the notch filter is given by equation (8).

$$\Omega_n = \frac{2\pi f_n}{f_s} \quad (8)$$

In equation (8), $f_n$ is the notch frequency, $f_s$, is the sampling frequency and $\Omega_n$ is the normalized notch frequency. The second-order all-pass filter 312 embedded within the structure of the filter unit 300A has a transfer function of the following form given by equation (8a).

$$H_a(z) = \frac{B_a(z)}{A_a(z)} = \frac{-\alpha_c + d(1-\alpha_c)z^{-1} + z^{-2}}{1 + d(1-\alpha_c)z^{-1} - \alpha_c z^{-2}} \quad (8a)$$

where d and αc are given in equations (9) and (1), respectively. The numerator coefficients of equation (8a) are the so-called "time reversal" of the denominator coefficients. This is a general property of all-pass filters, which can be expressed formally by equation (8b).

$$B_a(z)=z^{-M}\cdot A_a(z^{-1}) \quad (8b)$$

where M is the order of the all-pass filter. Here, M=2, for example. This economy of representation is reflected in the implementation efficiency of filters such as filter unit 300A. The parameters of the filter unit 300A, including the parameters of the embedded all-pass filter 312, are:

$$d = -\cos(\Omega_n) \quad (9)$$

$$K = 10^{\frac{G}{20}} \quad (10)$$

In equation (10), G is the gain of the notch filter in decibels (dB) and K is the attenuation of the notch.

$$\alpha_c = \frac{\tan\left(\frac{\Omega_n}{2Q}\right) - K}{\tan\left(\frac{\Omega_n}{2Q}\right) + K} \quad (11)$$

In equation (11), Q>0 is the quality factor of the notch filter. In some implementations. Q=1, and it may be omitted. In other implementations, Q provides an additional degree of freedom that may be used during the tuning process if desired.

$$H_0=K-1 \quad (12)$$

Based on equations (8)-(12), the fixed denominator coefficients of the transfer function of the notch filter are given by equations (13a), (13b) and (13c)

$$a_0=1 \quad (13a)$$

$$a_1=d\cdot(1-\alpha_c) \quad (13b)$$

$$a_2=-\alpha_c \quad (13c)$$

The fixed numerator coefficients for a generic notch filter that is derived from the filter unit 300A are given by equations (14a), (14b) and (14c).

$$b_0 = 1 + (1+\alpha_c)\cdot\frac{H_0}{2} \quad (14a)$$

$$b_1 = a_1 = d\cdot(1-\alpha_c) \quad (14b)$$

$$b_2 = -\alpha_c - (1+\alpha_c)\cdot\frac{H_0}{2} \quad (14c)$$

The numerator coefficients for the time-varying transfer function of a notch filter used in the equalizer circuit are based on the fixed numerator coefficients given by equations (14a)-(14c), weighted by the parameters dependent on the short term energy measurement of the associated sub-band, as described in the following sections.

Figure 4:
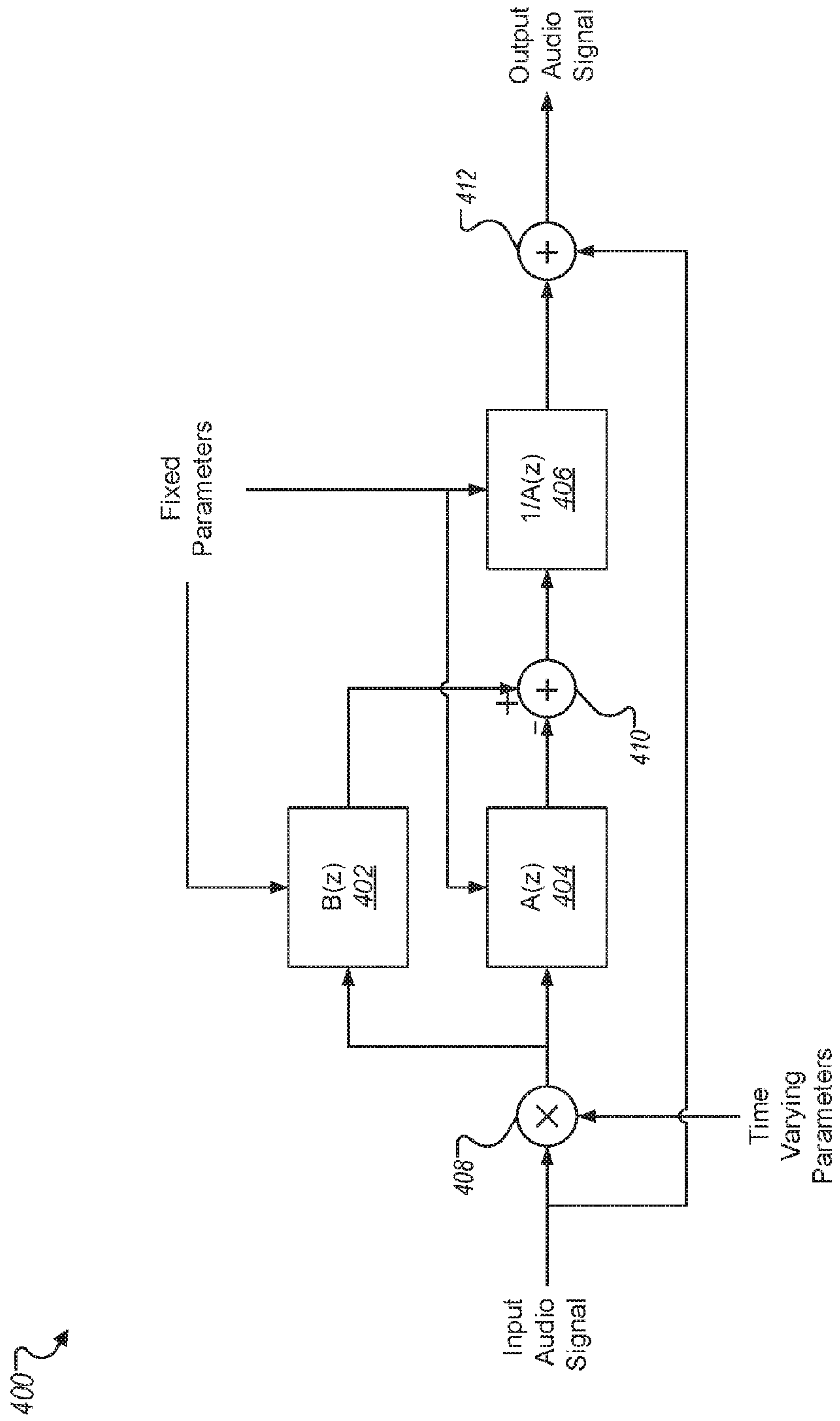
FIG. 4 illustrates a block diagram of an example of a notch filter that is part of an equalizer circuit of an audio processing circuit, according to one or more implementations.

FIG. 4 illustrates a block diagram of an example of a notch filter 400 that is part of an equalizer circuit of an audio processing circuit, according to one or more implementations. The notch filter 400 is similar to one or more of the filter units of the equalizer circuit 210, such as filter 1 212, filter 2 214 or filter N 216. The notch filter 400 processes a higher order sub-band of an input audio signal. In some implementations, the notch filter 400 is derived from the filter unit 300A.

As shown, the notch filter 400 includes a numerator polynomial B(z) 402 of the transfer function of the notch filter and denominator polynomials A(z) 404 and 1/A(z) 406 of the transfer function of the notch filter. The notch filter also includes a multiplier 408 and combiners 410 and 412.

The equalization operation performed by the notch filter 400 depends on the fixed parameters that are used to configure the notch filter 400, e.g., the parameters given by equations (8)-(12), the fixed denominator coefficients that are given by equations (13a), (13b) and (13c), and the fixed numerator coefficients that are given by equations (14a), (14b) and (14c). As shown by equations (8)-(14c), the numerator and denominator coefficients are based on the notch frequency, filter gain and filter quality factor. In some implementations, the fixed numerator coefficients are provided to the numerator polynomial B(z) 402, and the fixed denominator coefficients are provided to the denominator polynomials A(z) 404 and 1/A(z) 406, from the parameters unit 230.

The magnitude response of the notch filter 400, which is based on the transfer function of the notch filter, is manipulated in real time according to a weighting parameter $g_n$, which is provided to the notch filter 400 from the corresponding energy detector unit that is configured to process the sub-band associated with the notch filter. As shown in the following sections, while the denominator coefficients of the notch filter 400 remain fixed, the depth of the notch filter is manipulated by varying the numerator coefficients of the transfer function of the notch filter 400 based on a combination of the fixed numerator coefficients and the weighting parameter $g_n$, which depends on measuring the short-term energy level of the sub-band signal, as shown by equation (15).

$$g_n(e) = \begin{cases} 0 & e \le e_0 \\ \dfrac{e-e_0}{e(1-e_0)} & e > e_0 \end{cases} \quad (15)$$

In equation (15), e represents the short-term signal energy level of the sub-band that is measured by the energy detector unit. In some implementations, e is the smoothed value of the measured energy provided by an attack/release filter included in the energy detector unit, as described below. $e_0$ is the threshold energy value corresponding to the sub-band. As described previously, in some implementations, $e_0$ is programmed into the audio processing circuit, e.g., stored in the parameters unit 230, from where it is provided to the energy detector unit. As shown by equation (15), when the short-term energy e of the sub-band is lower than or equal to the threshold energy value, the notch filter does not attenuate the signal energy, since the weighting factor $g_n$ is 0. Accordingly, the depth of the notch filter 400 is varied based on the sub-band energy level. Different notch filters that are used to equalize different sub-bands of the input audio signal can therefore have different notch depths, depending on the measurement of the short-term energy for the associated sub-band.

The numerator polynomial B(z) and the denominator polynomial A(z) of the transfer function of the notch filter 400 are given by the equations (16a) and (16b).

$$B(z)=\Sigma_{m=0}^{M-1} b_m z^{-m} \quad (16a)$$

$$A(z)=\Sigma_{m=0}^{M-1} a_m z^{-m} \quad (16b)$$

In implementations in which second-order numerator and denominator are used, M=3 in equations (16a) and (16b).

As shown by FIG. 4, for a given value of e, the z-transform of the notch filter is given by equation (17).

$$H_n(z) = \frac{B_n(z)}{A_n(z)} = \frac{g_n\cdot B(z) + (1-g_n)\cdot A(z)}{A(z)} \quad (17)$$

Based on the z-transform given by equation (17) and the fixed numerator coefficients given by equations (14a), (14b) and (14c), the time-varying numerator coefficients $b_n=[b_{n0}, b_{n1}, b_{n2}]$ of the notch filter 400 are given by equations (18a), (18b) and (18c).

$$b_{n0}=g_n b_0+(1-g_n) \quad (18a)$$

$$b_{n1}=b_1 \quad (18b)$$

$$b_{n2}=g_n b_2+(1-g_n)a_2 \quad (18c)$$

In some implementations, the time-varying numerator coefficients of the notch filter 400 are determined based on the numerator coefficients of the analysis filter included in the corresponding energy detector unit that is configured to process the sub-band. In some implementations, the time-varying parameters given by equations (18a), (18b) and (18c) are determined by the corresponding energy detector unit, which provides these parameters to the notch filter 400, as described in the following sections.

Figure 5:
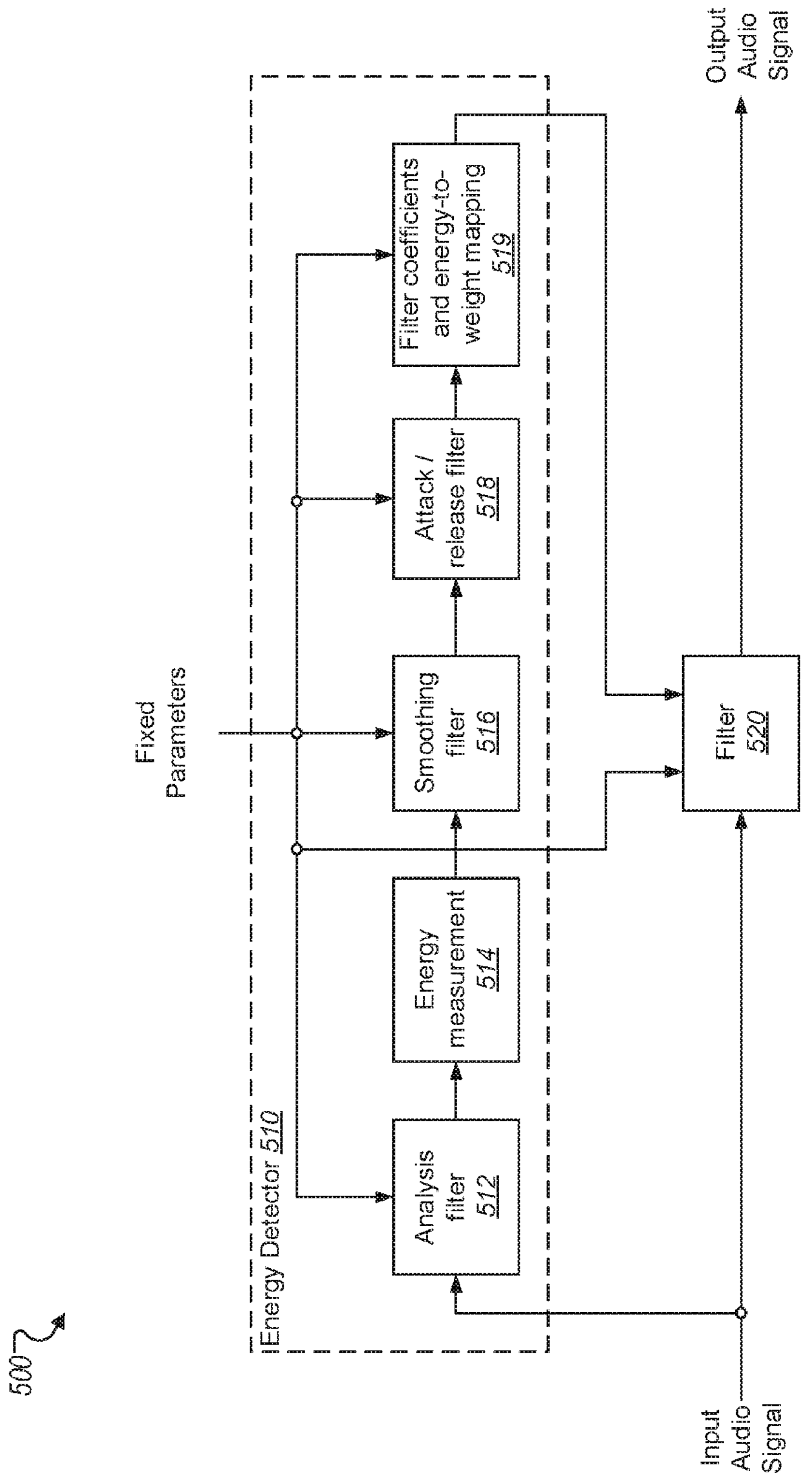
FIG. 5 illustrates an example of a portion of an audio processing circuit showing a block diagram of an energy detector unit that is part of the analyzer circuit of the audio processing circuit and a filter unit that is part of the equalizer circuit of the audio processing circuit, according to one or more implementations.

FIG. 5 illustrates an example of a portion of an audio processing circuit 500 showing a block diagram of an energy detector unit 510 that is part of the analyzer circuit of the audio processing circuit and a filter unit 520 that is part of the equalizer circuit of the audio processing circuit, according to one or more implementations. The energy detector section 510 includes an analysis filter 512, an energy measurement circuit 514, a smoothing filter 516, an attack/release filter 518, and filter coefficients and energy-to-weight mapping circuit 519.

In some implementations, the audio processing circuit 500 is similar to the audio processing circuit 200A. In such implementations, the energy detector unit 510 is similar to one or more of the energy detector units of the analyzer circuit 220, such as energy detector 1 222, energy detector 2 224 or energy detector N 226. The filter unit 520 is similar to one or more of the filter units of the equalizer circuit 210, such as filter 1 212, filter 2 214 or filter N 216.

The energy detector unit 510 processes a certain sub-band of an input audio signal. The sub-band that is processed depends on the fixed parameters used to configure the energy detector 510, e.g., the center frequency and bandwidth of the sub-band. Additionally, the fixed parameters provided to the energy detector 510 include the fixed denominator and numerator coefficients of the transfer function of the analysis filter 512. This is the case, for example, in implementations where the analysis filter 512 is derived from the filter unit 300A. The fixed denominator coefficients are given by equations (3a), (3b) and (3c) or equations (13a), (13b) and (13c), depending on whether the lowest sub-band or higher order sub-bands are processed, respectively, and considering implementations in which three sub-bands are processed (N=3). The numerator coefficients of the analysis filter 512 are described in the following sections with respect to equations (19) and (20).

In some implementations, the fixed parameters are supplied to the energy detector unit 510, e.g., to the analysis filter 512, the smoothing filter 516, the attack/release filter 518, and the filter coefficients and energy-to-weight mapping circuit 519, from the parameters unit 230.

The filter unit 520 is configured to equalize the same sub-band of the audio signal as the sub-band that is processed by the energy detector 510. This is achieved by configuring the filter unit 520 with the same fixed parameters that are provided to the energy detector 510, e.g., the center frequency and bandwidth of the sub-band, and the fixed denominator and numerator coefficients, which are computed as described above with respect to equations (13a)-(13c) and (14a)-(14c) respectively. In some implementations, the fixed parameters are supplied to the filter unit 520 from the parameters unit 230.

In addition to the fixed parameters, the filter unit 520 receives time-varying parameters from the energy detector 510, such as the weighting parameter $g_n$, and/or the time-varying numerator coefficients of the filter 520, e.g., as shown by equations (18a), (18b) and (18c). In some implementations, the weighting parameter $g_n$ and/or the time-varying numerator coefficients of the filter 520 are determined by the filter coefficients and energy-to-weight mapping circuit 519, and are provided to the filter unit 520 as the output of the energy detector unit 510. In some implementations, the filter coefficients and energy-to-weight mapping circuit 519 uses Klippel characterization data to map the measured energy of a sub-band to the weighting parameter $g_n$, and the time-varying numerator coefficients of the corresponding filter unit.

As noted above, in some implementations the analysis filter 512 and the associated filter unit 520 in the equalizer circuit are complimentary in the sense that their denominator coefficients are the same. As described previously, in some implementations, for the lowest sub-band, e.g., sub-band 0, the filter unit 520 is a shelf filter, whose numerator coefficients are given by equations (5a), (5b) and (5c), or (6a), (6b) and (6c), depending on the implementation. In such implementations, equation (19) provides the numerator coefficients of the corresponding analysis filter 512 for the lowest sub-band.

$$b_a^{(0)}=k\cdot[1\ 2\ 1] \tag{19}$$

where $k=\frac{1}{4}\sum_{m=0}^{2}a_m$. Equation (19) indicates that the analysis filter for the lowest sub-band corresponding to a shelf filter in the equalizer circuit has two zeroes at z=−1. In addition, the analysis filter has unity gain.

As described previously, in some implementations, for higher order sub-bands, e.g., sub-band 1, 2 or higher, the filter unit 520 includes a notch filter, whose time-varying numerator coefficients are given by equations (18a), (18b) and (18c). In such implementations, equation (20) provides the numerator coefficients of the corresponding analysis filter 512 for the higher order sub-bands.

$$b_a = \frac{K}{K-1}(a-b) \tag{20}$$

In equation (20), a and b are the denominator and numerator coefficient vectors respectively for the notch filter 520, and K is the attenuation parameter for the notch filter 520, as given by equation (10). K is the maximum possible attenuation of the time-varying notch filter, or equivalently, its minimum possible gain. Under the influence of the energy detector, the instantaneous attenuation of the notch filter is varied between 1 and K, where 0<K<1. The maximum attenuation may also be expressed as a logarithmic value, according to equation (10). In this case, the instantaneous notch attenuation varies between 0 dB and $G=20\cdot\log_{10}(K)$ dB, where G<0. K (or G) would ordinarily be a fixed parameter defined by the loudspeaker designer, depending on the resonance characteristics and other properties of a particular driver and enclosure design. The denominator and numerator coefficients and the attenuation parameter vary for different notch filters depending on the sub-band of the audio signal that is processed. Accordingly, the numerator coefficients of the analysis filter 512 are different for different sub-bands of the audio signal.

The analysis filter 512 is configured to extract a certain sub-band of the input audio signal, based on the fixed parameters of the analysis filter. The sub-band of the audio signal is provided to the energy measurement circuit 514, which is configured to measure the instantaneous or short-term energy level of the sub-band. In some implementations, the energy measurement circuit 514 measures the short-term energy using a squaring function. In other implementations, the energy measurement circuit 514 measures the short-term energy using an absolute value function.

The smoothing filter 516 is configured to smooth the sub-band of the audio signal measured by the energy measurement circuit 514. In some implementations, the smoothing filter includes a cascade of fixed, single-pole linear filters. The main purpose of the smoothing filter is to prevent audible artifacts from being introduced into the main signal path 520 as a result of modulating the equalization filter 520 too rapidly. An effective time constant on the order of a few milliseconds is sufficient to prevent such audible artifacts, while still providing timely protection for the loudspeaker when needed. Viewed in a qualitative way, the purpose of the smoothing filter is to align the effective timescale of the energy detector with that over which drive damage can take place.

The attack/release filter 518 is configured to regulate the attack (onset) and decay (cessation) of active equalization of the sub-band of the audio signal. Typically, the effective attack time realized by this filter would be chosen to be relatively short, in order to ensure that the loudspeaker driver is quickly protected when there is a sudden, unsafe increase in the level of the audio signal. In contrast, the decay time would be typically be relatively long by comparison. This rapid attack, gradual decay strategy tends to yield a more pleasant listener experience, while still protecting the loudspeaker. In some implementations, the attack/release filter 518 is a non-linear low-pass filter. The difference equation of the attack/release filter is given by equation (21).

$$y(k) = \begin{cases} \alpha_a y(k-1) + (1-\alpha_a)u(k) & u(k) > y(k-1) \\ \alpha_d y(k-1) + (1-\alpha_d)u(k) & u(k) \leq y(k-1) \end{cases} \quad (21)$$

In equation (21), u(k) and y(k) respectively represent the sub-band audio signal at the input and the output of the attack/release filter 518, and $\alpha_a$ and $\alpha_d$ are fixed parameters that determine the effective memory of the overall structure of the attack/release filter 518 in the attack and decay directions, respectively. In some implementations, $\alpha_a$ and $\alpha_d$ are stored in storage memory coupled to the audio processing circuit, e.g., in parameters unit 230, and are provided to the attack/release filter 518 during operation of the audio processing circuit.

It is often useful to characterize the dynamical behavior of a digital filter that is used for audio signal processing in terms of a continuous-time (analog) filter that is equivalent in some sense. For example, given a desired continuous-time attack or decay time constant $\tau$ in seconds, the corresponding digital filter coefficient of the attack/release filter 518 is:

$$\alpha = e^{-\frac{T_s}{\tau}} \quad (22)$$

where $T_s$ is the sampling period. The output of the attack/release filter is provided to the filter coefficients and energy-to-weight mapping circuit 519, which determines the weighting parameter $g_n$ and/or the time-varying numerator coefficients of the filter 520, as described previously.

In the above manner, the energy detector unit 510 works in tandem with the filter 520 in an audio processing circuit, e.g., audio processing circuit 200A to protect an associated audio device, e.g., audio device 100, from damage. As shown, the filter coefficients for an analysis filter and a corresponding equalization filter are related to achieve low computational complexity. The techniques described above allow the peak power output of the audio device to be maximized while introducing very limited coloration or distortion to the audio signal.

In some implementations, one or more of the shelf filter for the lowest sub-band audio signal, the filter unit 300A, the notch filter 400, the energy detector unit 510 and the filter unit 520 are programmed in a DSP that implements the audio processing circuit. For example, the various filters and energy detector unit components are realized as difference equations in firmware encoded in the chip. The fixed parameters are provided to the difference equations at run time during operation of the audio processing circuit from storage memory, e.g., flash memory, coupled to the DSP.

In some implementations, one or more of the shelf filter for the lowest sub-band audio signal, the filter unit 300A, the notch filter 400, the energy detector unit 510 and the filter unit 520 are implemented as discrete circuit components of an IC that implements the audio processing circuit. The fixed parameters are provided to the discrete circuit components at run time during operation of the audio processing circuit from storage memory, e.g., flash memory, coupled to the IC.

Figure 6:
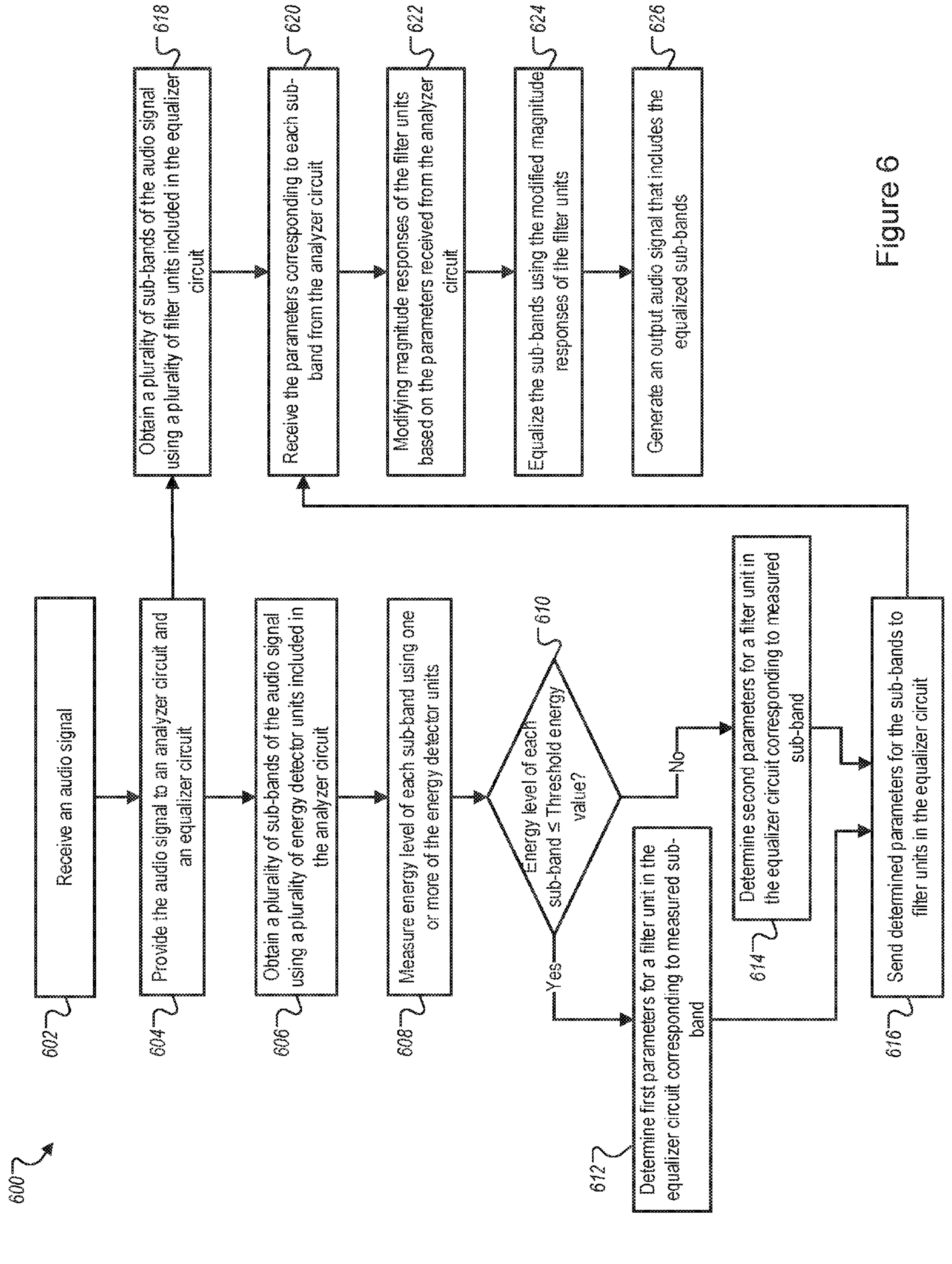
FIG. 6 illustrates an example of a process for equalizing an audio signal, according to one or more implementations.

FIG. 6 illustrates an example of a process 600 for equalizing an audio signal, according to one or more implementations. In some implementations, the process 600 is performed by an audio processing circuit, such as the audio processing circuit 200A. Accordingly, the following sections describe the process 600 with respect to the audio processing circuit 200A. However, the process 600 also may be performed by other suitable devices.

In some implementations, the process 600 is performed by one or more processors corresponding to the audio processing circuit 200A, e.g., a programmable DSP or an IC that implements the equalizer circuit 210 and the analyzer circuit 220, and associated functionalities, of the audio processing circuit 200A.

At 602, an audio signal is received. For example, an input audio signal is received at the audio processing circuit 200A. As described previously, in some implementations, the audio processing circuit 200A is similar to the audio processing circuit 102. In such implementations, an audio signal input to the audio device 100 is received at the audio processing circuit 102 for processing before being provided to the driver 110.

At 604, the audio signal is provided to an analyzer circuit and an equalizer circuit. For example, the audio processing circuit 200A splits the input audio signal along two paths. The audio signal is provided to the equalizer circuit 210 along a first path, and to the analyzer circuit 220 along a second path.

At 606, a plurality of sub-bands of the audio signal are obtained using a plurality of energy detector units included in the analyzer circuit. For example, the analyzer circuit 220 decomposes the input audio signal into sub-bands using the energy detector units energy detector 1 222, energy detector 2 224 and energy detector N 226. Each sub-band corresponds to a resonance frequency component of the audio signal, where the resonance frequency components are determined based on measuring the performance characteristics of the driver and enclosure of the audio device associated with the audio processing circuit, e.g., the audio device 100, and the surrounding acoustic environment. Each energy detector unit processes a predetermined sub-band of the audio signal.

As described previously, in some implementations, one or more of the energy detector units energy detector 1 222, energy detector 2 224, or energy detector N 226, is similar to the energy detector unit 510. In such cases, an energy detector uses an analysis filter, e.g., analysis filter 512, to extract the sub-band of the audio signal associated with the energy detector unit. The analysis filter is tuned to the parameters, e.g., center frequency and bandwidth, of the associated sub-band.

At 608, the energy level of each sub-band is measured using one or more of the energy detector units. For example, each energy detector unit included in the analyzer circuit 220 measures the short-term signal energy level of the sub-band associated with the respective energy detector unit. An energy detector unit uses an energy measurement circuit, e.g., energy measurement circuit 514, to perform the measurement.

At 610, the energy level of each sub-band is compared to a threshold energy level value to determine whether the energy level of the sub-band is less than or equal to the threshold energy level value. For example, each energy detector unit included in the analyzer circuit 220 compares the measured signal energy level of the sub-band associated with the respective energy detector unit to a threshold energy value. In some implementations, different sub-bands are compared to different threshold energy values. In other implementations, one or more sub-bands are compared to a common threshold energy value. An energy detector unit uses one or more of the smoothing filter 516, the attack/release filter 518 and the filter coefficients and energy-to-weight mapping circuit 519 to perform the threshold comparison.

If a determination is made at 610 that the energy level of a sub-band is less than or equal to the threshold energy level value, then at 612 first parameters are determined for a filter unit in the equalizer circuit that corresponds to the measured sub-band. For example, if an energy detector unit determines that the measured signal energy level of the sub-band associated with the respective energy detector unit is less than or equal to the threshold energy value corresponding to the sub-band, then the energy detector determines a value of a weighting parameter for the sub-band and, based on the weighting parameter, determines time-varying numerator coefficients of the transfer function of the corresponding filter unit associated with the respective sub-band. In some implementations, the filter coefficients and energy-to-weight mapping circuit 519 performs these computations. For the lowest sub-band, the value of the weighting parameter $g_s$, which is given by equation (4), is determined to be 1 (since $e \le e_0$ in this case), and the numerator coefficients are determined using this value of $g_s$, as shown by equations (5a)-(5c) or (6a)-(6c). For higher order sub-bands, the value of the weighting parameter $g_n$, which is given by equation (15), is determined to be 0 (since $e \le e_0$ in this case), and the numerator coefficients are determined as shown by equations (18a)-(18c).

On the other hand, if a determination is made at 610 that the energy level of a sub-band is greater than the threshold energy level value, then at 614 second parameters are determined for a filter unit in the equalizer circuit that corresponds to the measured sub-band. For example, if the filter coefficients and energy-to-weight mapping circuit 519 determines that the measured signal energy level of the sub-band associated with the respective energy detector unit is greater than the threshold energy value corresponding to the sub-band, then the filter coefficients and energy-to-weight mapping circuit 519 determines the value of the weighting parameter $g_s$ (in case the associated sub-band is the lowest sub-band) to be $$\frac{e_0}{e}$$

(since $e > e_0$ in this case), as given by equation (4), and the numerator coefficients are determined accordingly as shown by equations (5a)-(5c) or (6a)-(6c). For higher order sub-bands, the value of the weighting parameter $g_n$ is determined to be $$\frac{e - e_0}{e(1 - e_0)}$$

(since $e > e_0$ in this case), as given by equation (15), and the numerator coefficients are determined as shown by equations (18a)-(18c).

At 616, the determined parameters for the sub-bands are sent to filter units in the equalizer circuit. For example, each energy detector unit sends, to the corresponding filter unit in the equalizer circuit that is associated with the same sub-band, the time-varying numerator coefficients for the filter unit that is determined by the filter coefficients and energy-to-weight mapping circuit of the energy detector unit. As an example, energy detector 1 222 determines the parameters for filter 1 212, and sends these parameters to filter 1 212; energy detector 2 224 determines the parameters for filter 2 214, and sends these parameters to filter 2 214; and energy detector N 226 determines the parameters for filter N 216, and sends these parameters to filter N 216.

At 618, a plurality of sub-bands of the audio signal are obtained using a plurality of filter units included in the equalizer circuit. For example, the equalizer circuit 210 decomposes the input audio signal into sub-bands using the filter units filter 1 212, filter 2 214 and filter N 216. In some implementations, the equalizer circuit 210 obtains the same sub-bands as the analyzer circuit 220, which correspond to the resonance frequency components of the audio signal.

As described previously, each filter unit and the corresponding energy detector unit in the analyzer circuit are parameterized using the parameters, e.g., center frequency and bandwidth for a specific sub-band. For example, in some implementations the audio signal includes three sub-bands (N=3). Filter 1 212 and energy detector 1 222 are configured to process sub-band 0, e.g., configured with the center frequency and bandwidth for sub-band 0; filter 2 214 and energy detector 2 224 are configured to process sub-band 1; and filter N 216 and energy detector N 226 are configured to process sub-band 2. In such cases, filter 1 212 and energy detector 1 222 separately and concurrently obtain sub-band 0 of the input audio signal; filter 2 214 and energy detector 2 224 separately and concurrently obtain sub-band 1 of the input audio signal; and filter N 216 and energy detector N 226 separately and concurrently obtain sub-band 2 of the input audio signal.

At 620, the parameters corresponding to each sub-band are received from the analyzer circuit. For example, in some implementations, filter 1 212 is configured to process the same sub-band of the audio signal as processed by energy detector unit 1 222. The filter 1 212 receives the numerator coefficients of the transfer function of filter 1 212 from the corresponding energy detector 1 222. The numerator coefficients are computed by the energy detector 1 222 at 610, 612 and 614, as described above. Similarly, filter 2 214 is configured to process the same sub-band of the audio signal as processed by energy detector 2 224. Accordingly, filter 2 214 receives the numerator coefficients of the transfer function of the filter unit 2 from the energy detector 2 224. Filter N 216 is configured to process the same sub-band of the audio signal as processed by energy detector N 226. Accordingly, filter N 216 receives the numerator coefficients of the transfer function of the filter unit N from the energy detector N 226.

At 622, the magnitude responses of the filter units are modified based on the parameters received from the analyzer circuit. For example, filter 1 212 uses the time-varying numerator coefficients that are received from the corresponding energy detector 1 222 to adjust the transfer function of the filter 1 212, as shown by equations (5a)-(5c) or by equations (17) and (18a)-(18c), depending on whether the filter 1 212 is configured to process the lowest sub-band or higher order sub-bands, respectively. As noted previously, the transfer function affects the magnitude response of the filter. Similarly, filter 2 214 uses the time-varying numerator coefficients that are received from the corresponding energy detector 2 224 to adjust the magnitude response of the filter 2 214, and filter N 216 uses the time-varying numerator coefficients that are received from the corresponding energy detector N 226 to adjust the magnitude response of the filter N 216.

At 624, the sub-bands are equalized using the modified magnitude responses of the filter units. For example, each of the filter units filter 1 212, filter 2 214 and filter N 216 process the sub-band of the audio signal for which the filter unit is configured. Since the magnitude response of each filter unit is modified based on the time-varying numerator coefficients that are computed by the corresponding energy detector by comparing the sub-band signal energy level to a threshold energy value, each filter unit equalizes the associated sub-band upon processing the sub-band using the modified magnitude response. In doing so, if the short-term signal energy level of the associated sub-band is greater than the corresponding threshold energy value, then the signal energy is attenuated such that it is less than or equal to the corresponding threshold energy value. However, if the short-term signal energy level of the associated sub-band is less than or equal to the corresponding threshold energy value, then the sub-band is passed through by the filter unit without signal energy attenuation.

At 626, an output audio signal is generated that includes the equalized sub-bands. For example, the equalizer circuit 210 outputs an audio signal in which each sub-band of the audio signal is equalized by the filter unit that is configured to process a specific and different sub-band. Since the filter units, e.g., filter 1 212, filter 2 214 and filter N 216, are arranged in cascade, each filter unit equalizes its associated sub-band in the audio signal before providing the combined signal, with the associated sub-band equalized, to the next filter unit. After the final sub-band is equalized, e.g., by filter N 216, an audio signal is generated in which sub-bands corresponding to resonance frequency components of the audio device are equalized. As described previously, the audio processing circuit 200A provides the equalized audio signal to other components of the audio device, such as to the power amplifier 108 and/or the driver 110.

The disclosed and other examples can be implemented as one or more computer program products, for example, one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more of them. The term “data processing apparatus” encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry. e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data. e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices. e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An audio processing circuit comprising:

an analyzer circuit comprising a plurality of energy detector units; and an equalizer circuit comprising a plurality of equalization filters, the equalizer circuit being coupled with the analyzer circuit;

wherein the analyzer circuit is configured to receive an audio signal as an input, obtain a plurality of sub-bands of the audio signal using the plurality of energy detector units, measure energy of each sub-band, compare the energy of each sub-band to a threshold energy value, and based on the comparison for each sub-band, determine parameters for an equalization filter for processing the sub-band;

wherein at least one of the energy detector units comprises:

an analysis filter configured to obtain a specified sub-band of the audio signal based on frequency parameters provided to the analysis filter;

an energy measurement circuit configured to measure an energy associated with the specified sub-band; and a parameter mapping circuit configured to:

compare the measured energy to a threshold energy value corresponding to the specified sub-band;

based on the comparison, determine a level of signal energy attenuation for the specified sub-band; and provide parameters corresponding to the level of signal energy attenuation to an equalization filter that is associated with the specified sub-band; and wherein the equalizer circuit is configured to receive the audio signal as an input concurrently with reception of the audio signal by the analyzer circuit, obtain the plurality of sub-bands of the audio signal using the plurality of equalization filters, receive the parameters for the plurality of equalization filters from the analyzer circuit, equalize each sub-band by applying the parameters corresponding to the sub-band, and generate an output audio signal that includes the equalized sub-bands.

2. The audio processing circuit of claim 1, wherein the audio processing circuit is configured to be included in a speaker device, and wherein the plurality of sub-bands of the audio signal correspond to a plurality of resonance frequency components of the speaker device, the resonance frequency components based on one or more of a displacement transfer function of a speaker driver and speaker device enclosure, or a far-field sound pressure level (SPL) transfer function.

3. The audio processing circuit of claim 2, wherein the plurality of resonance frequency components includes a primary resonance frequency and one or more secondary resonance frequencies.

4. The audio processing circuit of claim 1, wherein a number of the energy detector units and a number of the equalization filters correspond to a number of the sub-bands of the audio signal, and wherein each of the sub-bands of the audio signal is associated with a distinct one of the energy detector units and a distinct one of the equalization filters.

5. The audio processing circuit of claim 4, wherein a magnitude response of an equalization filter associated with a sub-band is reciprocal of a magnitude response of one or more analysis filters included in a corresponding energy detector unit associated with the sub-band.

6. The audio processing circuit of claim 4, wherein a transfer function of an equalization filter associated with a sub-band has one or more denominator coefficients that are same as one or more denominator coefficients of one or more analysis filters included in a corresponding energy detector unit associated with the sub-band.

7. The audio processing circuit of claim 4, wherein an equalization filter associated with a sub-band includes one of:

a shelf filter when the sub-band corresponds to a lowest sub-band of the audio signal, a notch filter when the sub-band corresponds to a higher-order sub-band of the audio signal, or a notch filter when the sub-band corresponds to a lowest sub-band of the audio signal.

8. The audio processing circuit of claim 4, wherein magnitude responses of an analysis filter and an equalization filter associated with a particular sub-band are matched in shape and extent to a complex of one or more loudspeaker resonances within that sub-band.

9. The audio processing circuit of claim 1, wherein the level of signal energy attenuation is based on an amount by which the energy associated with the specified sub-band exceeds the corresponding threshold energy value.

10. The audio processing circuit of claim 1, wherein the frequency parameters include one or more of a center frequency or bandwidth corresponding to the specified sub-band.

11. The audio processing circuit of claim 1, wherein one or more of the frequency parameters or the threshold energy value are programmable by a user of the audio processing circuit.

12. The audio processing circuit of claim 1, wherein the parameter mapping circuit comprises:

a smoothing filter configured to reduce noise associated with the specified sub-band;

an attack and release filter configured to determine the level of signal energy attenuation for the specified sub-band based on the comparison to the threshold energy value; and an energy-to-weight mapping circuit configured to determine the parameters corresponding to the level of signal energy attenuation.

13. The audio processing circuit of claim 12, wherein the parameters determined by the energy-to-weight mapping circuit include one or more of:

a weighting parameter corresponding to the level of signal energy attenuation, or time varying coefficients for a magnitude response of the equalization filter that is associated with the specified sub-band.

14. The audio processing circuit of claim 1, wherein the analysis filter includes a bandpass filter.

15. The audio processing circuit of claim 1, wherein the plurality of equalization filters are arranged in series, and wherein an equalization filter comprises:

a linear filter configured to:

receive the audio signal as an input;

obtain a specified sub-band of the audio signal that corresponds to frequency parameters provided to the linear filter;

receive time-varying parameters corresponding to the specified sub-band from an energy detector unit associated with the specified sub-band;

manipulate a magnitude response of the linear filter based on the time-varying parameters;

attenuate energy of the specified sub-band based on the manipulation of the magnitude response of the linear filter; and output the audio signal with the energy of the specified sub-band attenuated.

16. The audio processing circuit of claim 15, wherein the frequency parameters include one or more of a center frequency or bandwidth corresponding to the specified sub-band.

17. The audio processing circuit of claim 15, wherein the time-varying parameters include one or more of:

a weighting parameter corresponding to a level of signal energy attenuation for the specified sub-band, or coefficients for the magnitude response of the linear filter, wherein the coefficients are determined based on a measurement of energy of the specified sub-band by the energy detector unit associated with the specified sub-band.

18. The audio processing circuit of claim 15, wherein the linear filter includes a notch filter, and wherein a depth of the notch filter is based on the time-varying parameters corresponding to the specified sub-band.

19. A method for processing an audio signal, comprising:

receiving the audio signal at an audio processing circuit;

providing the audio signal to an analyzer circuit and an equalizer circuit included in the audio processing circuit;

obtaining, using a plurality of energy detector units included in the analyzer circuit, a plurality of sub-bands of the audio signal;

measuring, using the energy detector units, energy of each sub-band;

comparing, using the energy detector units, the energy of each sub-band to a threshold energy value;

based on the comparison for each sub-band, sending parameters corresponding to each sub-band to the equalizer circuit;

obtaining, using a plurality of equalization filters included in the equalizer circuit, the plurality of sub-bands of the audio signal, wherein a number of the energy detector units and a number of the equalization filters correspond to a number of the sub-bands of the audio signal, wherein each of the sub-bands of the audio signal is associated with a distinct one of the energy detector units and a distinct one of the equalization filters, and wherein a transfer function of an equalization filter associated with a sub-band has one or more denominator coefficients that are same as one or more denominator coefficients of one or more analysis filters included in a corresponding energy detector unit associated with the sub-band;

receiving, at the equalizer circuit, the parameters corresponding to each sub-band from the analyzer circuit;

modifying magnitude responses of the equalization filters based on the parameters received from the analyzer circuit;

equalizing the sub-bands using the modified magnitude responses of the equalization filters; and generating an output audio signal that includes the equalized sub-bands.

20. The method of claim 19, wherein a magnitude response of an equalization filter associated with a sub-band is reciprocal of a magnitude response of one or more analysis filters included in a corresponding energy detector unit associated with the sub-band.

21. The method of claim 19, wherein comparing the energy of each sub-band to a threshold energy value comprises:

determining, by an energy detector unit associated with a specified sub-band, a level of signal energy attenuation for the specified sub-band based on an amount by which the energy associated with the specified sub-band exceeds a corresponding threshold energy value;

computing, by the energy detector unit, one or more of a weighting parameter corresponding to the level of signal energy attenuation, or time-varying coefficients for a magnitude response of an equalization filter that is associated with the specified sub-band; and sending, by the energy detector unit, one or more of the weighting parameter or the time-varying coefficients to the equalization filter.

22. The method of claim 21, further comprising:

receiving, at the equalization filter, one or more of the weighting parameter or the time-varying coefficients from the energy detector unit;

modifying, by the equalization filter, a magnitude response of the equalization filter based on the time-varying coefficients; and processing the specified sub-band by the equalization filter, wherein the processing comprises equalizing the specified sub-band based on the modified magnitude response of the equalization filter.

23. The method of claim 19, wherein the audio processing circuit is configured to be included in a speaker device, and wherein the plurality of sub-bands of the audio signal are based on determining a plurality of resonance frequency components of the speaker device using one or more of a displacement transfer function of a speaker driver and speaker device enclosure, or a far-field sound pressure level (SPL) transfer function.

24. The method of claim 19, wherein the audio processing circuit is included in a speaker device, and wherein obtaining the plurality of sub-bands of the audio signal comprises:

determining the plurality of sub-bands of the audio signal corresponding to a plurality of resonance frequency components of the speaker device, the resonance frequency components based on one or more of a displacement transfer function of a speaker driver and speaker device enclosure, or a far-field sound pressure level (SPL) transfer function, wherein the plurality of resonance frequency components includes a primary resonance frequency and one or more secondary resonance frequencies.

25. The method of claim 19, wherein obtaining the plurality of sub-bands of the audio signal comprises obtaining a specified sub-band of the audio signal based on frequency parameters, wherein one or more of the frequency parameters or the threshold energy value are programmable by a user of the audio processing circuit.

26. An audio device comprising:

a speaker driver; and an audio processing circuit configured to provide an equalized audio signal to the speaker driver, the audio processing circuit comprising:

an analyzer circuit comprising a plurality of energy detector units; and an equalizer circuit comprising a plurality of equalization filters, the equalizer circuit being coupled with the analyzer circuit, wherein a number of the energy detector units and a number of the equalization filters correspond to a number of sub-bands of the audio signal, wherein each of the sub-bands of the audio signal is associated with a distinct one of the energy detector units and a distinct one of the equalization filters, wherein the analyzer circuit is configured to receive an audio signal as an input, obtain a plurality of sub-bands of the audio signal using the plurality of energy detector units, measure energy of each sub-band, compare the energy of each sub-band to a threshold energy value, and based on the comparison for each sub-band, determine parameters for an equalization filter for processing the sub-band, wherein a magnitude response of an equalization filter associated with a sub-band is reciprocal of a magnitude response of one or more analysis filters included in a corresponding energy detector unit associated with the sub-band, and wherein the equalizer circuit is configured to receive the audio signal as an input concurrently with reception of the audio signal by the analyzer circuit, obtain the plurality of sub-bands of the audio signal using the plurality of equalization filters, receive the parameters for the plurality of equalization filters from the analyzer circuit, equalize each sub-band by applying the parameters corresponding to the sub-band, and provide, to the speaker driver, the equalized audio signal that includes the equalized sub-bands.

27. The audio device of claim 26, wherein the audio device comprises a portable Bluetooth loudspeaker.

28. The audio device of claim 26, wherein the plurality of sub-bands of the audio signal correspond to a plurality of resonance frequency components of the audio device, the resonance frequency components based on one or more of a displacement transfer function of the speaker driver and speaker device enclosure, or a far-field sound pressure level (SPL) transfer function.

29. The audio device of claim 26, wherein a transfer function of an equalization filter associated with a sub-band has one or more denominator coefficients that are same as one or more denominator coefficients of one or more analysis filters included in a corresponding energy detector unit associated with the sub-band.

30. The audio device of claim 26, wherein an equalization filter associated with a sub-band includes one of:

a shelf filter when the sub-band corresponds to a lowest sub-band of the audio signal, a notch filter when the sub-band corresponds to a higher-order sub-band of the audio signal, or a notch filter when the sub-band corresponds to a lowest sub-band of the audio signal.

* * * * *